(12) United States Patent
Arai et al.

(10) Patent No.: US 7,736,933 B2
(45) Date of Patent: Jun. 15, 2010

(54) METHOD FOR MANUFACTURING PHOTOELECTRIC CONVERSION DEVICE

(75) Inventors: Yasuyuki Arai, Atsugi (JP); Shunpei Yamazaki, Setagaya (JP)

(73) Assignee: Semiconductor Energy Laboratory Co., Ltd, Atsugi-shi, Kanagawa-ken (\*) Notice: Subject to any disclaimer, the term of this patent is extended or adjusted under 35 U.S.C. 154(b) by 0 days.

(21) Appl. No.: 12/219,241

(22) Filed: Jul. 18, 2008

(65) Prior Publication Data
US 2009/0029503 A1    Jan. 29, 2009

(30) Foreign Application Priority Data
Jul. 27, 2007   (JP) .............................. 2007-195641

(51) Int. Cl.
*H01L 21/00* (2006.01)
(52) U.S. Cl. .................................. 438/57; 118/723 MW
(58) Field of Classification Search ................... 438/57, 438/61, 96, 97, 584, 758, 761; 118/715–733, 118/723 MW; 156/345.41–345.42
See application file for complete search history.

(56) References Cited

U.S. PATENT DOCUMENTS

| | | | |
|---|---|---|---|
| 4,409,134 A | 10/1983 | Yamazaki | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,701,167 A | 12/1997 | Yamazaki | |
| 5,849,601 A | 12/1998 | Yamazaki | |
| 5,859,445 A | 1/1999 | Yamazaki | |
| 5,932,302 A | 8/1999 | Yamazaki et al. | |
| 5,968,274 A \* | 10/1999 | Fujioka et al. | .............. 118/718 |
| 6,011,277 A | 1/2000 | Yamazaki | |
| 6,023,075 A | 2/2000 | Yamazaki | |

(Continued)

FOREIGN PATENT DOCUMENTS

JP    62-062073    3/1987

(Continued)

OTHER PUBLICATIONS

Arai.T et al., "41.2: Micro Silicon Technology for Active Matrix OLED Display,", SID Digest '07 : SID International Symposium Digest of Technical Papers, 2007, vol. 38, pp. 1370-1373.

*Primary Examiner*—Charles D Garber
*Assistant Examiner*—Bryan R Junge
(74) *Attorney, Agent, or Firm*—Eric J. Robinson; Robinson Intellectual Property Law Office, P.C.

(57) ABSTRACT

To form a microcrystalline semiconductor with high quality which can be directly formed at equal to or less than 500° C. over a large substrate with high productivity without decreasing a deposition rate. In addition, to provide a photoelectric conversion device which employs the microcrystalline semiconductor as a photoelectric conversion layer. A reactive gas containing helium is supplied to a treatment chamber which is surrounded by a plurality of juxtaposed waveguides and a wall, the pressure in the treatment chamber is maintained at an atmospheric pressure or a subatmospheric pressure, microwave is supplied to a space sandwiched between the juxtaposed waveguides to generate plasma, and a photoelectric conversion layer of a microcrystalline semiconductor is deposited over a substrate which is placed in the treatment chamber.

20 Claims, 16 Drawing Sheets

U.S. PATENT DOCUMENTS

| | | | |
|---|---|---|---|
| 6,171,674 B1 | 1/2001 | Yamazaki et al. | |
| 6,183,816 B1 | 2/2001 | Yamazaki et al. | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,468,617 B1 | 10/2002 | Yamazaki et al. | |
| 6,737,676 B2 | 5/2004 | Yamazaki | |
| 6,835,523 B1 | 12/2004 | Yamazaki et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,211,454 B2 | 5/2007 | Yamazaki et al. | |
| 7,229,862 B2 | 6/2007 | Yamazaki et al. | |
| 7,301,215 B2 * | 11/2007 | Kariya | 257/458 |
| 7,432,468 B2 * | 10/2008 | Oka et al. | 219/121.43 |
| 2003/0062129 A1 * | 4/2003 | Ni | 156/345.42 |
| 2003/0143822 A1 * | 7/2003 | Kondo et al. | 438/485 |
| 2004/0221809 A1 | 11/2004 | Ohmi et al. | |
| 2005/0012887 A1 | 1/2005 | Koyama et al. | |
| 2005/0022864 A1 | 2/2005 | Fujioka et al. | |
| 2005/0089648 A1 | 4/2005 | Yamazaki et al. | |
| 2006/0225656 A1 * | 10/2006 | Horiguchi | 118/723 MW |
| 2006/0238132 A1 | 10/2006 | Kitamura et al. | |
| 2006/0246738 A1 | 11/2006 | Isobe et al. | |
| 2007/0018165 A1 | 1/2007 | Yamazaki | |
| 2007/0057258 A1 | 3/2007 | Fukuchi et al. | |
| 2007/0163996 A1 * | 7/2007 | Horiguchi | 216/67 |
| 2008/0299689 A1 | 12/2008 | Yamazaki | |
| 2009/0029498 A1 | 1/2009 | Yamazaki et al. | |
| 2009/0047752 A1 | 2/2009 | Yamazaki et al. | |

FOREIGN PATENT DOCUMENTS

| | | |
|---|---|---|
| JP | 62-062073 B2 | 12/1987 |
| JP | 02-053941 | 2/1990 |
| JP | 02-053941 B2 | 11/1990 |
| JP | 11-103082 | 4/1999 |
| JP | 2000-277439 | 10/2000 |
| JP | 2004-014958 | 1/2004 |
| JP | 2005-049832 | 2/2005 |
| JP | 2007-005705 | 1/2007 |
| JP | 2007-048982 | 2/2007 |

* cited by examiner

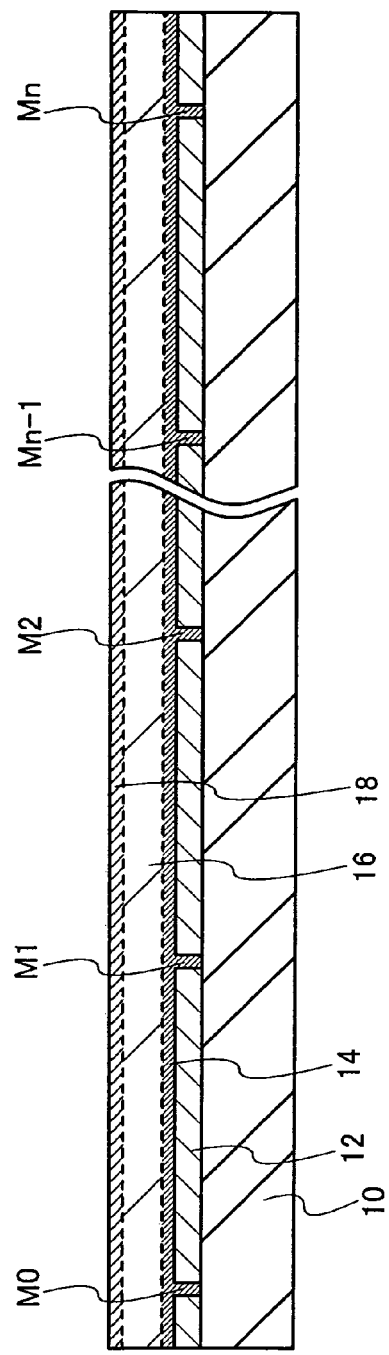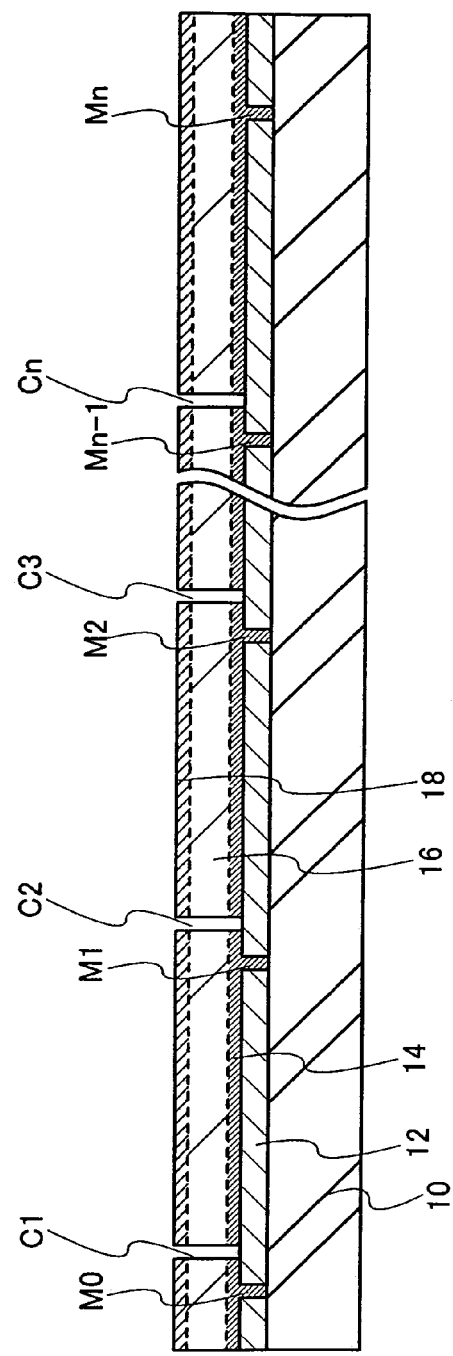
FIG. 10A
FIG. 10B

METHOD FOR MANUFACTURING PHOTOELECTRIC CONVERSION DEVICE

BACKGROUND OF THE INVENTION

1. Field of the Invention

The present invention relates to a method for manufacturing photoelectric conversion devices using a microcrystalline semiconductor as a photoelectric conversion layer.

2. Description of the Related Art

To deal with global environmental issues in recent years, the market for photoelectric conversion devices such as residential photovoltaic systems has expanded. As photoelectric conversion devices, devices using a single-crystal or polycrystalline silicon wafer which has high conversion efficiency have been used in practice. The photoelectric conversion devices are manufactured using single-crystal or polycrystalline silicon which is cut out from a large silicon ingot. However, it takes a long time to manufacture large silicon ingots, which deteriorates productivity, and since the supply of silicon raw materials is limited, the supply of silicon ingots is insufficient and cannot deal with the expansion of the market.

Photoelectric conversion devices using amorphous silicon have been developed, and reduction of cost seems possible therewith. However, a problem of light deterioration has not been overcome, and thus the photoelectric conversion devices using amorphous silicon have not been commonly used. In addition, although a high-frequency plasma CVD method for manufacturing amorphous silicon can form an film over a large area at low temperature, which can make conversion efficiency of a photoelectric conversion device using amorphous silicon as a photoelectric conversion layer be equal to or greater than 10%; light deterioration called Staebler-Wronski effect can not be overcome. Therefore, development of photoelectric conversion devices has been proceeding, in which microcrystalline silicon, which is crystal silicon and a film of which can be manufactured by a plasma CVD method, is used as a photoelectric conversion layer (for example, refer to Reference 1: Japanese Published Patent Application No. 2000-277439).

As for a crystal silicon film formed by a plasma CVD method and a photoelectric conversion device using the crystal silicon film, photoelectric conversion devices using a microcrystalline semiconductor such as a semi-amorphous semiconductor or a semicrystalline semiconductor, which is different from an amorphous semiconductor and a crystalline semiconductor, were reported by the inventors of the present invention (for example, refer to References 2 and 3: Examined Patent Application Publication No. H2-53941 and Examined Patent Application Publication No. S62-62073).

SUMMARY OF THE INVENTION

In order to use microcrystalline silicon as a photoelectric conversion layer, the thickness of the microcrystalline silicon needs to be equal to or greater than 1 μm, preferably about 10 μm; however, the deposition rate of a microcrystalline silicon film by a high-frequency plasma CVD method is equal to or less than 0.1 nm/sec. even under the optimum film forming condition and is not practical. In other words, the use of a microcrystalline silicon film for a photoelectric conversion layer leads to problems such as low productivity and low cost competitiveness compared to the cost competitiveness of a photoelectric conversion device using another kind of crystal silicon.

It is an object of the present invention to dissolve those problems and provide a method for manufacturing microcrystalline semiconductor films and a method for manufacturing photoelectric conversion devices using a microcrystalline semiconductor as a photoelectric conversion layer, without reducing a deposition rate. In addition, it is another object of the present invention to provide a manufacturing apparatus which produces the photoelectric conversion devices.

In a manufacturing apparatus provided with means such as means which supplies a reactive gas containing helium to a treatment chamber which is surrounded by a plurality of juxtaposed waveguides and a wall, a reactive gas containing helium is supplied, the pressure in the treatment chamber is maintained at atmospheric pressure or subatmospheric pressure, microwave is supplied to a space sandwiched between the juxtaposed waveguides to generate plasma, and a photoelectric conversion layer of a microcrystalline semiconductor is deposited over a substrate which is placed in the treatment chamber. A slit is provided on a side of the plurality of juxtaposed waveguides which faces another waveguide. By supplying microwave into the treatment chamber through the slit to generate plasma, the density of the plasma can be heightened. The pressure of the treatment chamber at the time of generating plasma is an atmospheric pressure or a subatmospheric pressure, typically, equal to or greater than $1 \times 10^2$ Pa and equal to or less than $1 \times 10^5$ Pa (equal to or greater than 1 Torr and equal to or less than 760 Torr).

A photoelectric conversion layer includes an intrinsic semiconductor layer between an impurity semiconductor layer to which an impurity imparting one conductivity type is added and an impurity semiconductor layer to which an impurity imparting the other conductivity type which is opposite to the one conductivity type is added. In the present invention, a photoelectric conversion layer at least includes the intrinsic semiconductor layer formed of a microcrystalline semiconductor. In addition, since a plurality of waveguides are juxtaposed and high-density plasma can be generated in a space sandwiched between the waveguides, a semiconductor layer of the present invention can be stably formed even under a pressure of about equal to or greater than $1 \times 10^2$ Pa and equal to or less than $1 \times 10^5$ Pa.

Here, an intrinsic semiconductor refers to a semiconductor in which the concentration of an impurity imparting one conductivity type (an impurity imparting p-type or n-type conductivity) is equal to or less than $1 \times 10^{20}$ cm$^{-3}$ and the concentration of oxygen and nitrogen is equal to or less than $9 \times 10^{19}$ cm$^{-3}$, and the photoconductivity is 100 times or more than the dark conductivity. This intrinsic semiconductor may contain an impurity imparting p-type or n-type conductivity, that is, an impurity belonging to Group 13 or 15 of the periodic table. This is because, since a microcrystalline semiconductor has weak n-type conductivity even when an impurity element for controlling valence electrons is not added intentionally, an impurity imparting p-type conductivity may be added to an intrinsic semiconductor layer of a microcrystalline semiconductor intentionally or unintentionally at the time of film formation or after the formation. This semiconductor layer is referred to as a substantial intrinsic semiconductor layer and included in an intrinsic semiconductor layer in the present invention. These layers are collectively referred to as an intrinsic semiconductor layer (hereinafter also referred to as an i-type semiconductor layer).

A microcrystalline semiconductor film according to the present invention is a semiconductor film in which crystal grains are dispersed in an amorphous semiconductor film. Different from a polycrystalline semiconductor film, such a microcrystalline semiconductor film can be directly formed over a substrate while including minute crystalline structures or crystal grains. Specifically, SiH$_4$ is diluted with a diluent gas at a flow ratio of 2 to 1000 times, preferably 10 to 100 times, electromagnetic energy in a microwave band is supplied to excite the gas into a plasma state, and a microcrystalline semiconductor is deposited over the substrate while the radical reaction is induced. The diluent gas can be either one or a combination of hydrogen, a rare gas (such as helium, argon, krypton, or neon), and a halogen gas (such as fluorine or chlorine); and a plurality of helium, argon, krypton, and neon, which are rare gases, can be combined to be used. Thus manufactured microcrystalline semiconductor contains crystal grains with a diameter of 0.5 nm to 20 nm in an amorphous semiconductor. In the present invention, such a semiconductor may be used at least for a photoelectric conversion layer. Note that the entire photoelectric conversion layer in the film thickness direction is not necessary formed of a microcrystalline semiconductor or a semiconductor similar to a microcrystalline semiconductor, and the photoelectric conversion layer may include a microcrystalline semiconductor at least partially in the film thickness direction.

According to the present invention, pressure at the time of forming a microcrystalline semiconductor film is set at an atmospheric pressure or a subatmospheric pressure and microwave plasma is generated; therefore, the microcrystalline semiconductor film can be formed at a deposition rate of about 50 times as high as a conventional one and a microcrystalline semiconductor with high quality can be obtained. By forming a photoelectric conversion layer using such a microcrystalline semiconductor, a rate of deterioration in characteristics by light degradation is decreased to be one-fifth to one-tenth of a conventional one, and thus, a photoelectric conversion device that has almost no problems for practical use can be obtained. In addition, since the photoelectric conversion device may have a photoelectric conversion layer having a thickness of 0.5 μm to 10 μm, resources can be saved compared to a photoelectric conversion device using a single-crystal or polycrystalline silicon wafer.

BRIEF DESCRIPTION OF THE DRAWINGS

FIGS. 10A and 10B are cross-sectional views illustrating manufacturing steps of a photoelectric conversion device which uses a microcrystalline semiconductor for a photoelectric conversion layer;

DETAILED DESCRIPTION OF THE INVENTION

Figure 1A:
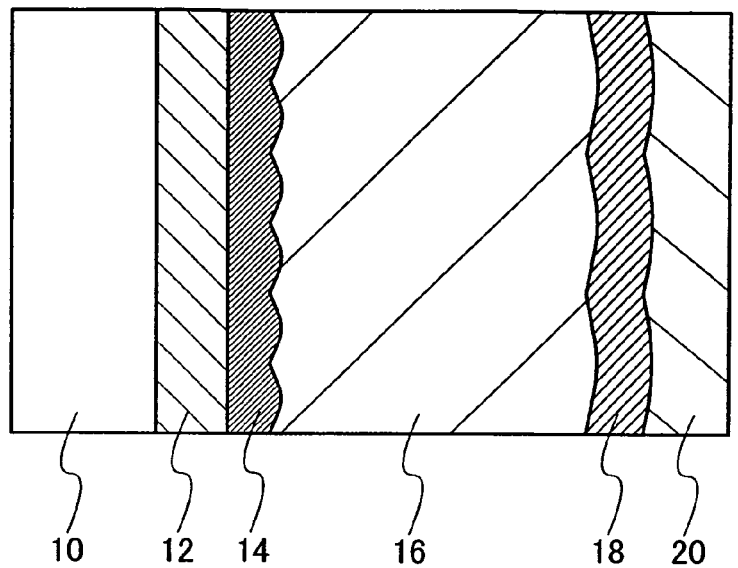
FIGS. 1A and 1B illustrate a photoelectric conversion device using a microcrystalline semiconductor for a photoelectric conversion layer.

Hereinafter, an embodiment mode of the present invention will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiment mode to be given below. Note that same portions in the drawings may be denoted by the same reference numerals in a structure of the present invention to be given below.

FIG. 1A illustrates a structure of a photoelectric conversion device of this embodiment mode. The photoelectric conversion device includes at least one semiconductor junction by providing an i-type semiconductor layer 16 between a p-type semiconductor layer 14 and an n-type semiconductor layer 18. In this embodiment mode, all of those semiconductor layers are formed using a microcrystalline semiconductor layer.

A substrate 10 can be various commercial glass plates such as soda-lime glass, lead glass, strengthened glass, or ceramic glass. Alternatively, an alkali free glass substrate such as an aluminoborosilicate glass substrate or a barium borosilicate glass substrate; a quartz substrate, or a metal substrate such as a stainless steel substrate can be used. In the case where light enters from the substrate 10, a first electrode 12 is formed of a transparent conductive film material such as indium oxide, indium tin oxide, or zinc oxide. On the other hand, in the case where the first electrode 12 is a reflective electrode, the first electrode 12 is formed of a metal material such as aluminum, silver, titanium, or tantalum. In the case where the first electrode 12 is a reflective electrode, light can be blocked by making depressions and projections on a surface of the electrode, which leads to improvement in conversion efficiency of the photoelectric conversion device and is preferable.

The p-type semiconductor layer 14 is formed of a microcrystalline semiconductor containing boron as an impurity imparting one conductivity-type. In order to reduce light absorption loss, carbon may be contained in the p-type semiconductor layer 14 so that the optical gap is widened.

The i-type semiconductor layer 16 is an intrinsic semiconductor which is formed of a microcrystalline semiconductor (typically, microcrystalline silicon). Note that an i-type semiconductor refers to a semiconductor in which the concentration of an impurity imparting p-type or n-type conductivity is equal to or less than $1\times10^{20}$ cm$^{-3}$ and the concentration of oxygen and nitrogen is equal to or less than $5\times10^{19}$ cm$^{-3}$, and the photoconductivity is 100 times or more than the dark conductivity. In particular, the concentration of oxygen may be equal to or less than $1\times10^{19}$ cm$^{-3}$, preferably equal to or less than $5\times10^{18}$ cm$^{-3}$. This is because oxygen serves as a donor in a microcrystalline semiconductor. The thickness of the i-type semiconductor layer 16 is 0.1 μm to 10 μm, preferably 0.5 μm to 5 μm, and more preferably 1 μm to 3 μm.

To the i-type semiconductor layer 16, 1 ppm to 1000 ppm of an impurity imparting p-type conductivity may be added. In other words, since a microcrystalline semiconductor has weak n-type conductivity when an impurity element for controlling valence electrons is not added intentionally, in the case where the microcrystalline semiconductor is used as the i-type semiconductor layer 16, an impurity element imparting p-type conductivity is preferably added at the time of film formation or after the film formation. The impurity element imparting p-type conductivity is typically boron, and an impurity gas such as $B_2H_6$ or $BF_3$ may be mixed into a semiconductor material gas at a rate of 1 ppm to 1000 ppm. The concentration of boron may be, for example, $1\times10^{14}$ cm$^{-3}$ to $6\times10^{16}$ cm$^{-3}$.

A microcrystalline semiconductor includes a semiconductor having an intermediate structure between an amorphous and crystalline structure (including single-crystal and polycrystal). This semiconductor has the third state which is stable in terms of free energy, is a crystal substance having short-range order and lattice distortion, and can be dispersed in a non-single-crystal semiconductor with its grain size of 0.5 nm to 20 nm. Further, hydrogen or a halogen is contained at least 1 at. % or more than 1 at. % for terminating dangling bonds. Further promotion of lattice distortion by including a rare gas such as helium, argon, krypton, or neon increases stability and favorable microcrystal can be obtained. Such microcrystalline silicon has lattice distortion which changes the optical characteristics from the indirect transition of single-crystal silicon into the direct transition. At least 10% of lattice distortion makes the optical characteristics change into the direct transition type. Note that when distortion exits locally, the optical characteristics in which the direct transition and the indirect transition are mixed can be obtained.

A microcrystalline semiconductor is formed by exciting a semiconductor material gas typified by silane into plasma with electromagnetic energy in a microwave band and depositing a reaction product. A typical semiconductor material gas is $SiH_4$, and $Si_2H_6$, $SiH_2Cl_2$, $SiHCl_3$, $SiCl_4$, $SiF_4$, or the like can also be used. The plasma may be generated under an atmospheric pressure or a subatmospheric pressure (equal to or greater than $1\times10^2$ Pa and equal to or less than $1\times10^5$ Pa). When plasma is generated under such a pressure, a radical reaction proceeds in a gas phase. The radical reaction and a reaction on the surface of the film improve the film formation rate. In this case, when microwave is discharged with pulse of 1 kHz to 100 kHz, the gas phase reaction is controlled, whereby the abnormal growth in the gas phase, such as generation in particles in the gas phase, can be suppressed. By diluting the semiconductor material gas with a diluent gas, plasma generated under an atmospheric pressure or a subatmospheric pressure can be stabilized, which can facilitate formation of microcrystals. The diluent gas can be either one or a combination of hydrogen, a rare gas (such as helium, argon, krypton, or neon), and a halogen gas (such as fluorine or chlorine); and a plurality of helium, argon, krypton, and neon can be combined to be used. The semiconductor material gas is preferably diluted 10 to 2000 times. A microcrystalline semiconductor is formed using such a reactive gas containing a semiconductor material gas and a diluent gas.

For generating plasma, 1 GHz to 5 GHz, typically, 2.45 GHz of an electromagnetic wave may be supplied. A substrate heating temperature is preferably equal to or less than 500° C., and the substrate heating temperature of 100° C. to 400° C. is recommended. Further, hydride of carbon such as $CH_4$ or $C_2H_6$, germanium hydride or germanium fluoride such as $GeH_4$ or $GeF_4$ may be mixed into the semiconductor material gas to adjust the energy band to be 1.5 eV to 2.4 eV or 0.9 eV to 1.1 eV.

The n-type semiconductor layer 18 is formed of a microcrystalline semiconductor containing phosphorus as an impurity imparting one conductivity. The n-type semiconductor layer 18 may be formed of an amorphous semiconductor as an alternative to a microcrystalline semiconductor. A second electrode 20 over the n-type semiconductor layer 18 is formed using a metal material such as aluminum, silver, titanium, tantalum, or chromium. Note that in the case where light enters from the second electrode 20 side, the second electrode 20 is formed of a transparent conductive material.

Although FIG. 1A illustrates a structural example of the photoelectric conversion layer which includes the p-type semiconductor layer 14, the i-type semiconductor layer 16, and the n-type semiconductor layer 18, a structure alternative to this pin junction can be employed as a semiconductor junction included in the photoelectric conversion layer.

Figure 1B:
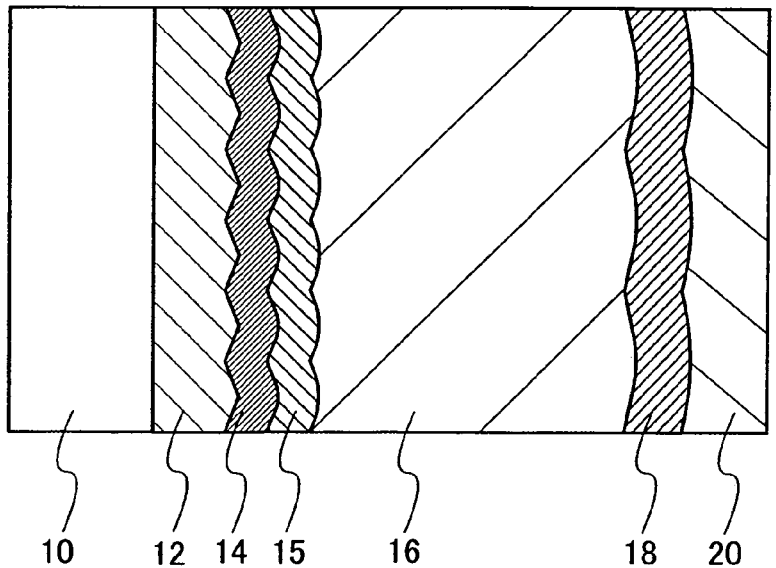

FIG. 1B illustrates a structure in which a p$^-$-type semiconductor layer 15 is provided between the p-type semiconductor layer 14 and the i-type semiconductor layer 16. The concentration of an impurity imparting p-type in the p$^-$-type semiconductor layer 15 is lower than that in the p-type semiconductor layer 14. By providing the p$^-$-type semiconductor layer 15 between the p-type semiconductor layer 14 and the i-type semiconductor layer 16, a carrier-transporting property at an interface of the semiconductor junction is improved. When the p-type impurities in the p$^-$-type semiconductor layer 15 are distributed so that concentration thereof is decreased in stepwise or continuously from the p-type semiconductor layer 14 to the i-type semiconductor layer 16, a carrier-transporting property is further improved. Further, since an interface level density is reduced and the diffusion potential is improved with this structure, an open circuit voltage of the photoelectric conversion device is increased.

Figure 2A:
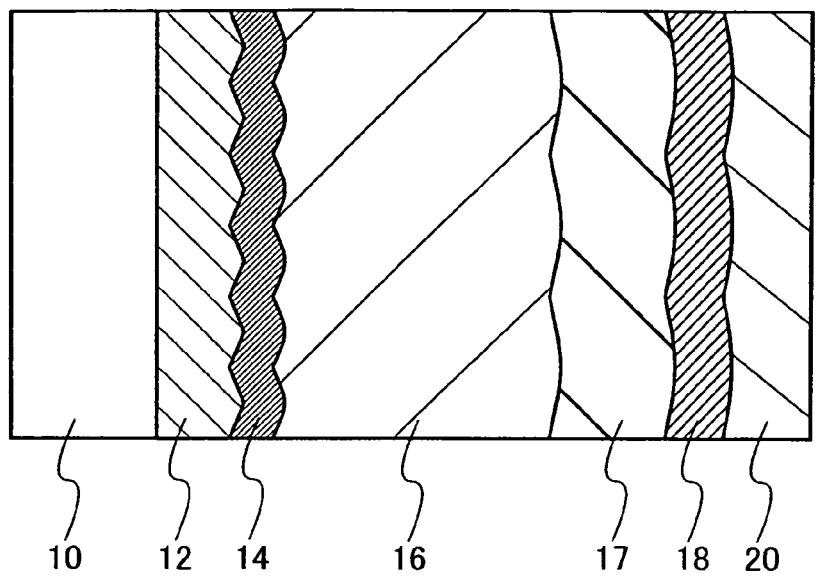
FIGS. 2A and 2B illustrate a photoelectric conversion device using a microcrystalline semiconductor for a photoelectric conversion layer.

FIG. 2A illustrates a structure in which an i'-type semiconductor layer 17 formed of an amorphous semiconductor is provided between the i-type semiconductor layer 16 and the n-type semiconductor layer 18. The i'-type semiconductor layer 17 is different from the i-type semiconductor layer 16 in that the i'-type semiconductor layer 17 does not have crystallinity. The i'-type semiconductor layer 17 absorbs light that has not been absorbed by the i-type semiconductor layer 16 (in the case where external light enters from the substrate 10 side). The optical gap of the i-type semiconductor layer 16 is about 1.4 eV while the optical gap of the i'-type semiconductor layer 17 is 1.6 eV to 1.8 eV, that is, the i'-type semiconductor layer 17 has higher absorption coefficient of visible light. Therefore, it is possible that the i'-type semiconductor layer 17 absorb light that has not been absorbed by the i-type semiconductor layer 16. The film thickness of the i'-type semiconductor layer 17 may be one tenth to half of that of the i-type semiconductor layer 16. Among photogenerated carriers of the i'-type semiconductor layer 17, holes flow towards the p-type semiconductor layer 14. However, since holes pass through the i-type semiconductor layer 16 having a high carrier-transporting property, recombination loss can be reduced. In other words, with the above-described structure, photoelectric current can be increased.

Figure 2B:
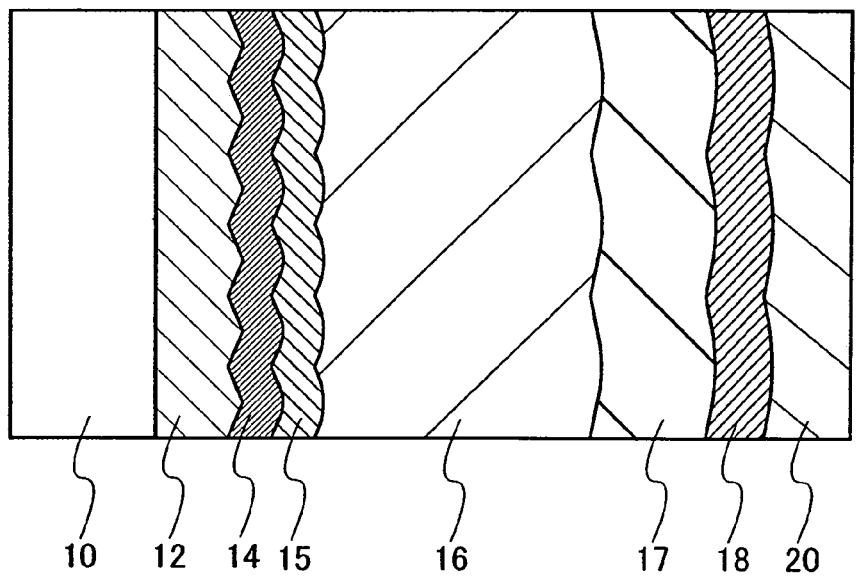

FIG. 2B illustrates a structure in which the p⁻-type semiconductor layer 15 is provided between the p-type semiconductor layer 14 and the i-type semiconductor layer 16, and the i'-type semiconductor layer 17 formed of an amorphous semiconductor is provided between the i-type semiconductor layer 16 and the n-type semiconductor layer 18. Since an interface level density is reduced and the diffusion potential is improved with this structure, an open circuit voltage of the photoelectric conversion device is increased and photoelectric current can be increased.

In such a photoelectric conversion device, the semiconductor layers are preferably formed successively without their interfaces being exposed to air. Further, a minute amount of impurity element is added to each semiconductor layer for controlling valence electrons; therefore, it is preferable to use a microwave plasma CVD apparatus having a multi-chamber structure which is provided with a plurality of treatment chambers. In particular, it is preferable to use plasma in a microwave plasma CVD method, in which the electron density is greater than or equal to $1\times10^{11}$ cm$^{-3}$ and less than or equal to $1\times10^{13}$ cm$^{-3}$, and the electron temperature is approximately greater than or equal to 0.2 eV and less than or equal to 2.0 eV (more preferably, greater than or equal to 0.5 eV and less than or equal to 1.5 eV). When plasma with high electron density and low electron temperature is utilized, plasma damage is small and defects are reduced; therefore, a microcrystalline semiconductor film with high quality can be formed. An example of an apparatus suitable for formation of a microcrystalline semiconductor film is described below.

Figure 3:
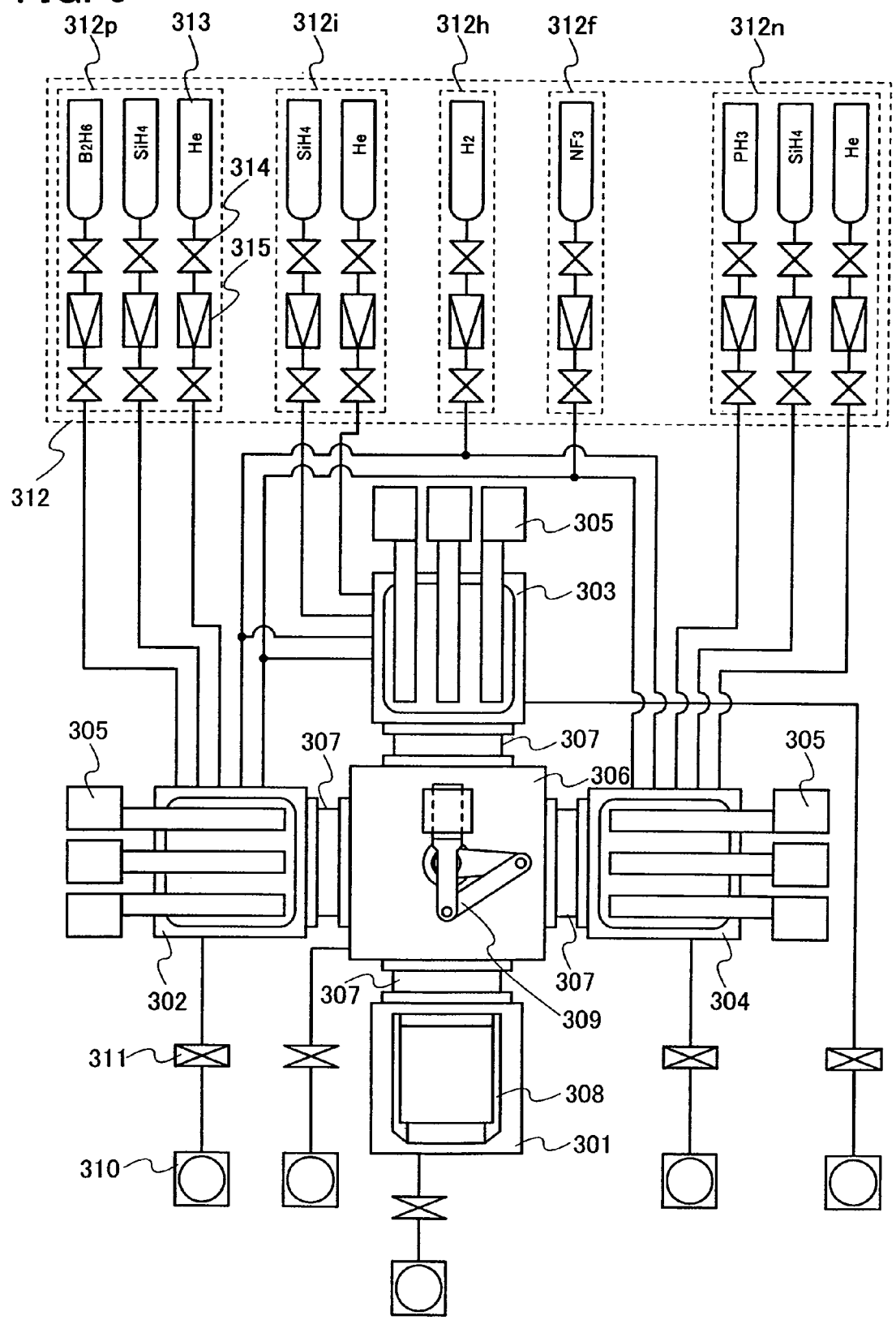
FIG. 3 illustrates a structure of a multi-chamber microwave plasma CVD apparatus provided with a plurality of treatment chambers.

FIG. 3 illustrates an example of a multi-chamber microwave plasma CVD apparatus provided with a plurality of treatment chambers. This apparatus is provided with a load/unload chamber 301, a first treatment chamber 302, a second treatment chamber 303, and a third treatment chamber 304 around a common chamber 306. The first to third treatment chambers 302 to 304 have a structure in which a plurality of waveguides are placed at the top surface, and in which the side surface and the bottom surface consist of a wall. A p-type semiconductor layer is formed in the first treatment chamber 302, an i-type semiconductor layer is formed in the second treatment chamber 303, and an n-type semiconductor layer is formed in the third treatment chamber 304.

A substrate to be treated is transferred to a treatment chamber via the common chamber 306. Gate valves 307 are provided between the common chamber 306 and each of the chambers so that treatment performed in chambers does not interfere with each other. The substrate is placed in a cassette 308 in the load/unload chamber 301 and transferred to the first treatment chamber 302, the second treatment chamber 303, or the third treatment chamber 304 by a transfer means 309 of the common chamber 306.

A gas supply means 312 and an evacuation means 310 are connected to each treatment chamber so that the air in each treatment chamber can be replaced with an inert gas or a nitrogen gas and a gas for treatment can be flown under a pressure of about equal to or greater than $1\times10^2$ Pa and equal to or less than $1\times10^5$ Pa. Since film formation with this apparatus is performed under the foregoing pressure, the evacuation means 310 preferably has high suction and evacuation capability. A switching valve 311 is provided between the evacuation means 310 and each of the treatment chambers to control an evacuation speed.

The gas supply means 312 includes a cylinder 313, a valve 314, a mass flow controller 315, and the like. The cylinder 313 is filled with a gas which is used in a process such as a semiconductor material gas and a rare gas, and the like. When helium is used as a rare gas, plasma can be stably generated. A gas supply means 312p is connected to the first treatment chamber 302 and supplies a gas for a p-type semiconductor layer. A gas supply means 312i is connected to the second treatment chamber 303 and supplies a gas for an i-type semiconductor layer. A gas supply means 312n is connected to the third treatment chamber 304 and supplies a gas for an n-type semiconductor layer. A gas supply means 312h supplies hydrogen, and a gas supply means 312f supplies an etching gas which is used for cleaning the inside of the treatment chambers, and they are a line shared by the treatment chambers.

Each treatment chamber has a plasma generation means 305. The plasma generation means 305 includes an oscillator which generates plasma in the treatment chamber. For example, the plasma generation means 305 consists of a microwave power supply, a microwave amplifier, a waveguide which carries microwave to the treatment chamber, and the like. Each treatment chamber has one or plurality of the plasma generation means 305. The number of plasma generation means 305 may be determined in accordance with a substrate to be treated so that a film which is formed over the substrate can be uniform.

Figure 4:
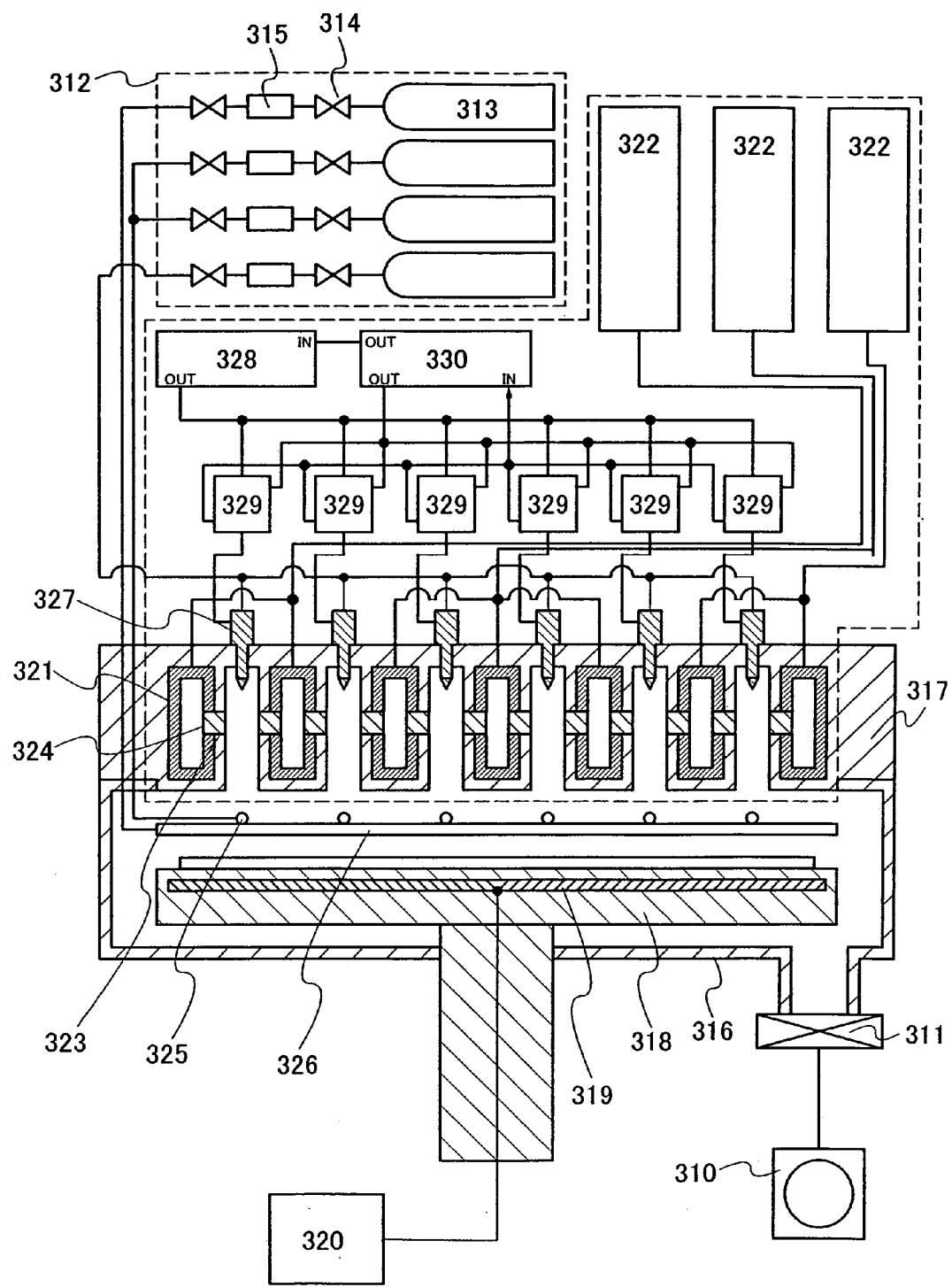
FIG. 4 illustrates a structure of a treatment chamber in a multi-chamber microwave plasma CVD apparatus provided with a plurality of treatment chambers.

FIG. 4 is a cross-sectional view illustrating an example of a treatment chamber. The treatment chamber includes a treatment container 316 and a cover 317. The treatment container 316 has a wall. The cover 317 has a plurality of waveguides 321 which are juxtaposed in a comb-shape. The treatment container 316 and the cover 317 have a sealed structure so that a pressure can be maintained at about equal to or greater than $1\times10^2$ Pa and equal to or less than $1\times10^5$ Pa. The treatment container 316 is formed of, for example, a metal such as stainless steel or aluminum.

The treatment chamber, in which a sealed space is formed with the cover 317 and the treatment container 316, is provided with the gas supply means 312 so that the air in the treatment chamber can be replaced with an inert gas or a nitrogen gas. The evacuation means 310 which is connected to the treatment chamber evacuates a gas supplied to the treatment chamber. The evacuation means 310 may consist of a vacuum pump in order to carry out replacement of the air in the treatment chamber with more reliability.

A susceptor 318 on which an object to be treated, such as a substrate, is placed is provided in the treatment container 316. The susceptor 318 is formed of a ceramic material such as aluminum nitride, silicon nitride, or silicon carbide. A heater 319 is provided inside the susceptor 318. The heater 319 is connected to a heater power supply 320. The heater 319 is embedded in the susceptor 318 and generates heat by being supplied with power from the heater power supply 320 to keep the substrate that is placed on the susceptor 318 at a predetermined temperature.

The cover 317 is provided as the top surface of the treatment container 316 to seal the treatment container 316. The plural waveguides 321 included in the cover 317 are juxtaposed with small gaps therebetween so as to be projected in a comb-shape in the treatment chamber. The waveguides are juxtaposed with a gap of equal to or greater than 2 mm and equal to or less than 10 mm. The plural waveguides 321 are juxtaposed for one treatment substrate. Each of such waveguides 321 is linked to a microwave power supply 322. A slit 323 is provided in the waveguide 321 so as to leak microwave. Leakage refers to a state in which the slit 323 is covered with a dielectric plate 324 which transmits microwave and the microwave is supplied through the dielectric plate 324. The dielectric plate 324 is formed of quartz or the like and fills the slit 323 so that a gas for treatment does not flow into the waveguide 321. The dielectric plate 324 is placed on the center of a side wall of the waveguide 321 in order to generate plasma uniformly. The slit 323 is positioned on each side wall of the juxtaposed waveguides which faces another waveguide. That is, the slits 323 face each other.

The gas supply means 312 includes the cylinder 313 filled with a gas for treatment, the valve 314, the mass flow controller 315, and the like. A gas for treatment whose flow rate is adjusted by the mass flow controller 315 is supplied into the treatment container 316. The cylinder 313 is filled with a gas for treatment which is needed for film formation of a microcrystalline semiconductor. The gas for treatment which is needed for film formation includes a semiconductor material gas such as silane or disilane, a diluent gas (any of hydrogen, fluorine, or a rare gas such as helium or argon), and the like. The treatment container 316 has a gas nozzle 325 and a gas nozzle 326, and the gas for treatment flows into the treatment container 316 through the gas nozzles. For example, any of hydrogen, fluorine, or a rare gas such as helium or argon is supplied to the gas nozzle 325, then, high-density radicals are generated in the vicinity of the dielectric plate 324 to which microwave is supplied; accordingly, a surface reaction is promoted on a surface of the substrate to be treated over which the microcrystalline semiconductor is formed. A semiconductor material gas such as silane or disilane is supplied to the gas nozzle 326. In such a manner, by separating a gas supply path, deposition of a film onto the dielectric plate 324 can be suppressed. During film formation, any of hydrogen, fluorine, or a rare gas such as helium or argon may be continuously supplied through the gas nozzle 325.

Microwave is supplied into the treatment chamber through the dielectric waveguide plate 324. By juxtaposing the waveguides 321 and providing the slit 323 on each side of the waveguides 321 which faces another waveguide, high-density plasma can be generated in a space sandwiched between the waveguides 321. For example, if a surface wave which propagates on a surface of the dielectric plate 324 is used to form surface wave plasma, high-density uniform plasma can be formed with non-electromagnetic field microwave electric discharge. In that case, plasma is formed in a small space which is sandwiched between the waveguides 321, that is, in a small gap; therefore, plasma can be stably formed even under a pressure of about equal to or greater than $1 \times 10^2$ Pa and equal to or less than $1 \times 10^5$ Pa. The gap between the waveguides is in a range of equal to or greater than 2 mm and equal to or less than 10 mm. The gap can be narrower as the pressure gets higher and the gap can be wider as the pressure gets lower.

The space sandwiched between the waveguides 321 is provided with plasma generators 327 which are arranged in a manner such that the gap between the plasma generators 327 is wider than that between the waveguides 321 which are juxtaposed. A plurality of plasma generators 327 are provided along the waveguides 321 in the space sandwiched between the waveguides 321. The plasma generator 327 is connected to a microwave power supply 328 which is different from the one to which the waveguide 321 is connected. A power amplifier 329 is provided between the microwave power supply 328 and the plasma generator 327. The plasma generator 327 is operated when microwave power is introduced to the waveguide 321 to start discharging to trigger plasma.

The plasma generator 327 has a plasma monitor function which examines the state of plasma and an output value therefrom is input to the power amplifier 329. As for a method to examine the state of plasma, a Langmuir probe is used for example, and an electron density, an electron temperature, and the like are examined. A measurement value of the plasma which is examined with a plurality of plasma generators 327 which are provided in the treatment chamber is input to the control circuit 330. According to the value, an individual control signal for changing amplification factors is output to each power amplifier 329 so that the plasma in the treatment chamber has a uniform density, which is effective for suppressing the phenomenon called a jumping phenomenon of plasma in which a high density region of plasma moves in a discharge space.

The above-described microwave plasma CVD apparatus has a plurality of waveguides which are juxtaposed; therefore, uniform plasma can be generated even when a substrate size is increased. Substrates having various sizes can be flexibly treated, which are typified by glass substrates for liquid crystal displays having a size of 300 mm×400 mm called the first generation, 550 mm×650 mm called the third generation, 730 mm×920 mm called the fourth generation, 1000 mm×1200 mm called the fifth generation, 2450 mm×1850 mm called the sixth generation, 1870 mm×2200 mm called the seventh generation, and 2000 mm×2400 mm called the eighth generation, or the like.

Figure 5:
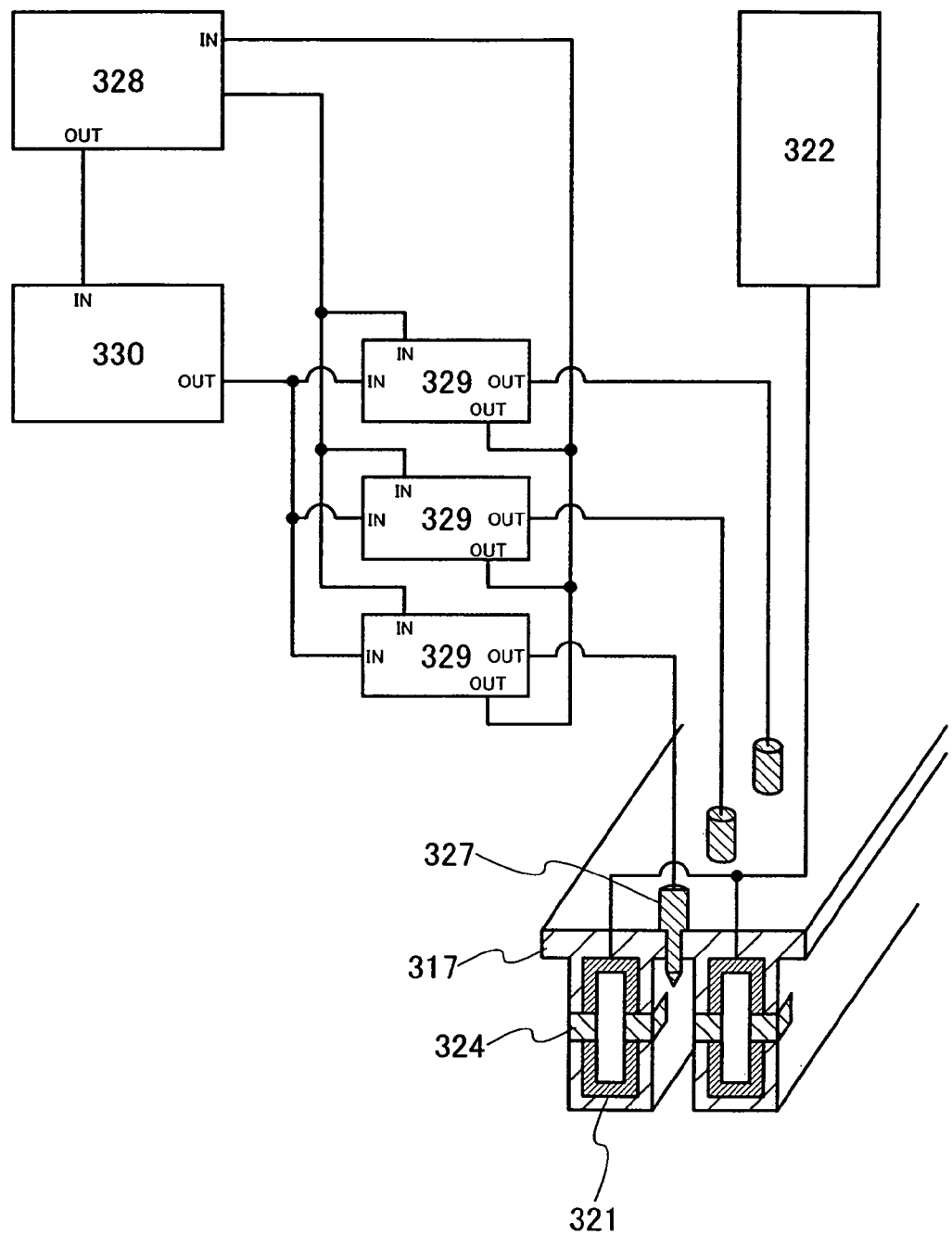
FIG. 5 illustrates details of a cover portion of a treatment chamber in a multi-chamber microwave plasma CVD apparatus provided with a plurality of treatment chambers.

FIG. 5 is a perspective view illustrating a structure of the cover 317 and the waveguide 321 in the above-described treatment chamber. Since the waveguides are juxtaposed, narrow groove-shaped spaces which are sandwiched by the waveguides are formed. The dielectric plates 324 are provided to cover the slits 323 on opposing sides of the juxtaposed waveguides 321 and microwave is leaked from the slits 323 to generate plasma. A plurality of plasma generators 327 are provided along the narrow groove-shaped spaces sandwiched between the juxtaposed waveguides 321.

Figure 6:
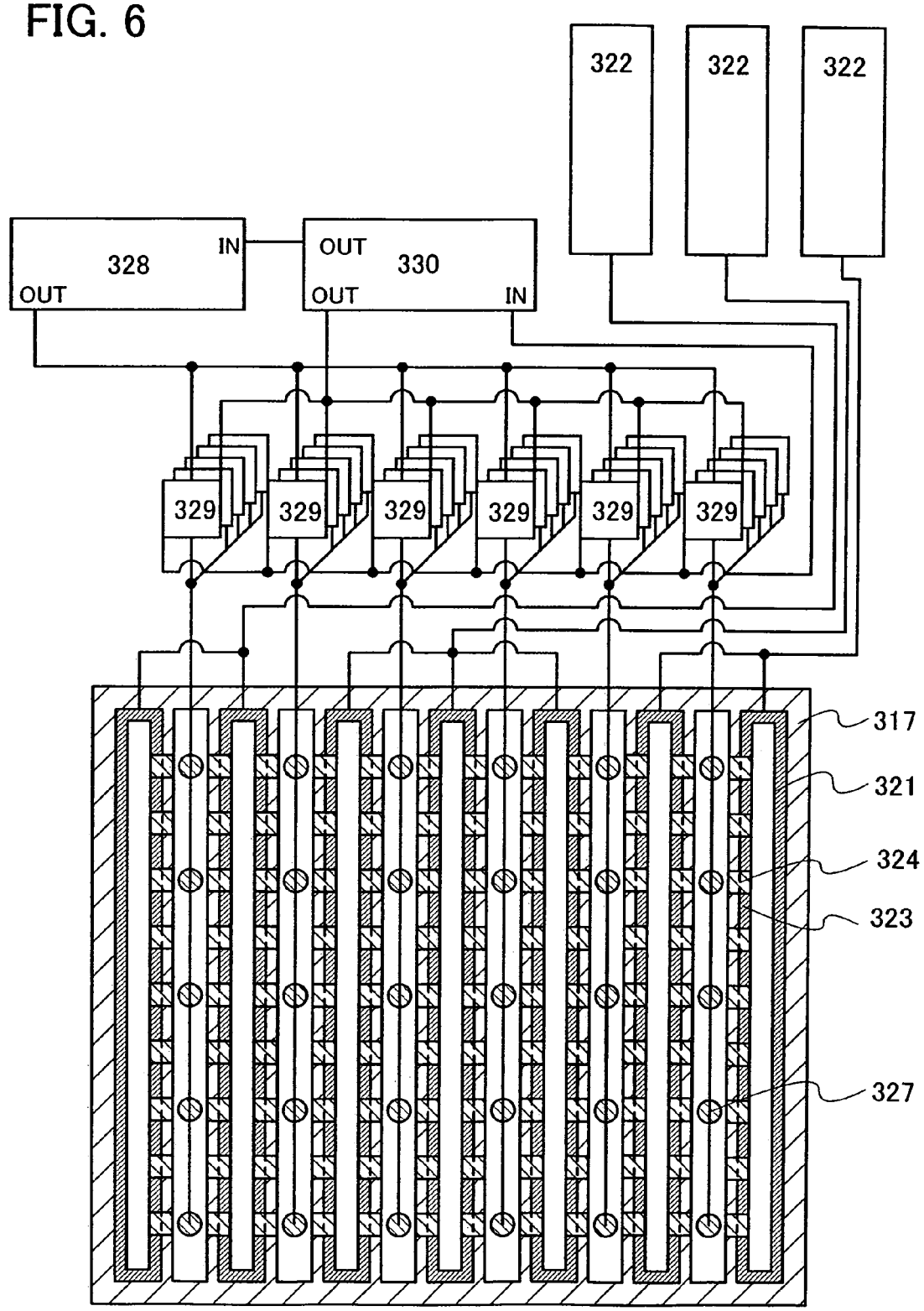
FIG. 6 is a plan view illustrating a structure of a treatment chamber in a multi-chamber microwave plasma CVD apparatus provided with a plurality of treatment chambers.

FIG. 6 is a plan view illustrating a structure of the cover 317. A plurality of the waveguides 321 are juxtaposed and are extended in parallel. The waveguide 321 has the slit 323 so that microwave is leaked from the slit 323. The slit 323 is positioned on each side of the juxtaposed waveguides which faces another waveguide. The slit 323 is covered with the dielectric plate 324 which transmits microwave so that a gas for treatment does not flow into the waveguide 321. Even when the substrate to be treated has a large area, plasma density can be uniform by juxtapositioning a plurality of waveguides 321 and generating microwave discharge in the space sandwiched between the waveguides 321. Further, the plasma density can be uniform by providing a plurality of plasma generators 327 to which power is supplied from the microwave power supply 328 in the space between the waveguides 321 and by controlling the plasma generators 327 with the power amplifier 329 and the control circuit 330 to stabilize the plasma. With such a structure, treatment can be performed on, for example, a glass substrate having a size of 730 mm×920 mm or a glass substrate having a side longer than 1 m.

Figure 7:
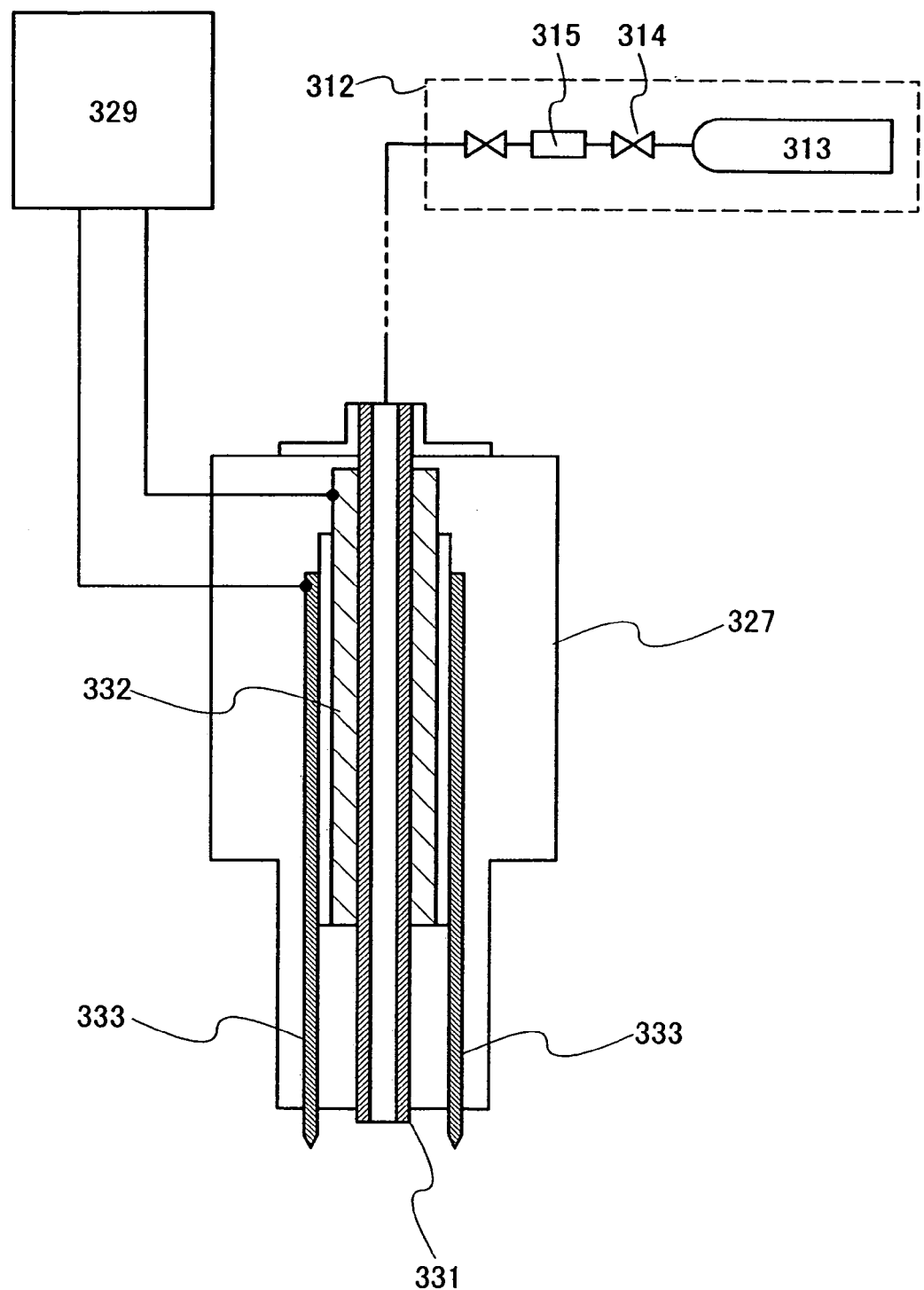
FIG. 7 illustrates a structure of a plasma generator 327.

FIG. 7 illustrates a structure of the plasma generator 327. A gas nozzle 331 which is formed of quartz or the like is connected to the gas supply means 312. A discharge electrode 332 to which microwave power is supplied is provided on an outer side of the gas nozzle 331. A gas which is not deposited and has low breakdown voltage, such as helium, is supplied to the gas nozzle 331 and power is supplied to the discharge electrode 332 to perform electrodeless discharge. The plasma generated in the gas nozzle 331 is diffused outside the nozzle. By providing the plasma generator 327 in the treatment chamber, the plasma generated here triggers discharge. A probe 333 is prepared for examining plasma, and a Langmuir probe is used, for example. This monitored value is input to the control circuit 330 via the power amplifier 329.

Figure 8:
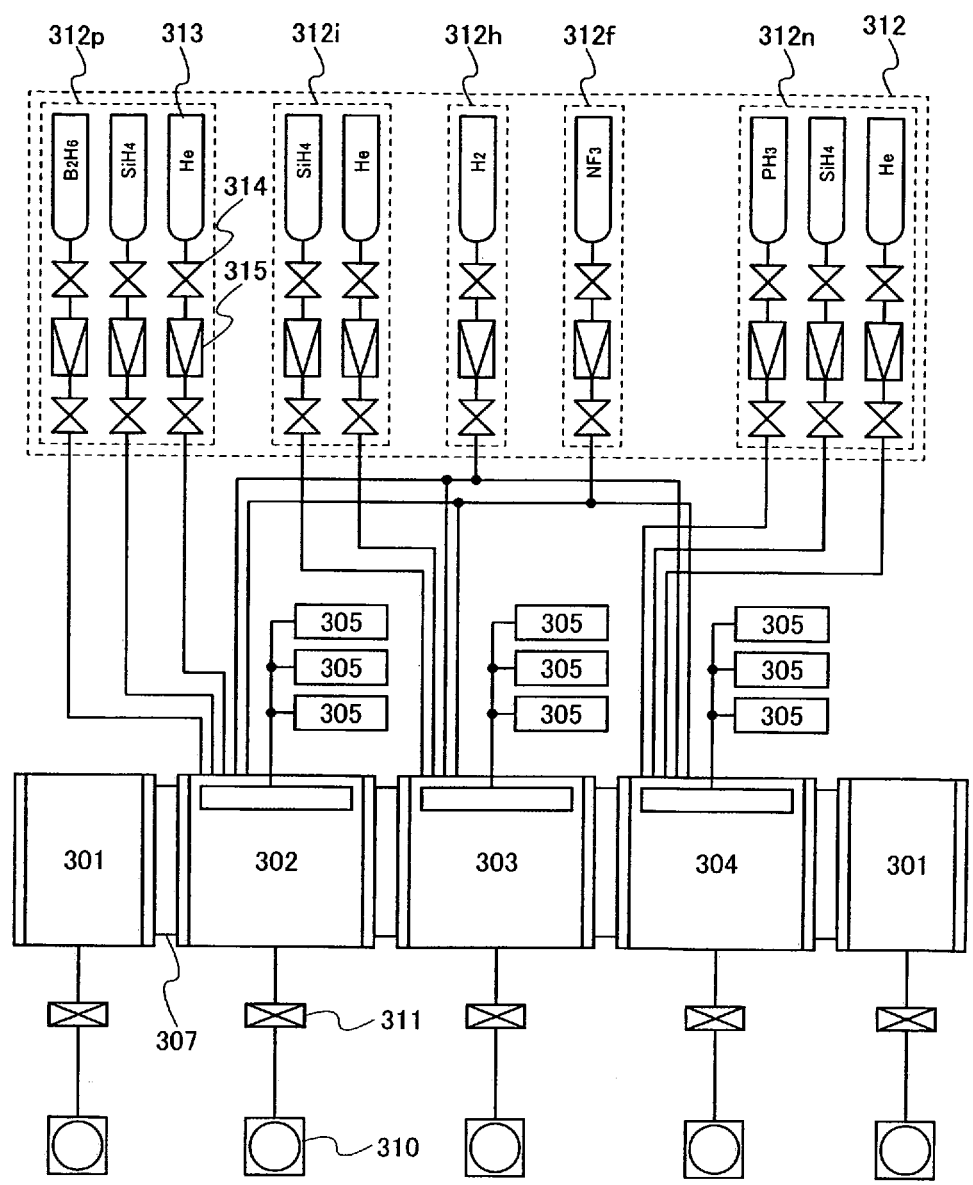
FIG. 8 illustrates an example of an in-line multi-chamber microwave plasma CVD apparatus.

FIG. 8 illustrates an example of an in-line multi-chamber microwave plasma CVD apparatus provided with a plurality of treatment chambers. The apparatus has a structure in which the first treatment chamber 302, the second treatment chamber 303, and the third treatment chamber 304 are connected in series. The first treatment chamber 302 and the third treatment chamber 304 each have the load/unload chamber 301. The treatment chambers are separated by the gate valves 307. A p-type semiconductor layer is formed in the first treatment chamber 302, an i-type semiconductor layer is formed in the second treatment chamber 303, and an n-type semiconductor layer is formed in the third treatment chamber 304.

The gas supply means 312 and the evacuation means 310 are connected to each treatment chamber so that the air in each treatment chamber can be replaced with an inert gas or a nitrogen gas and a gas for treatment can be flown under a pressure of about equal to or greater than $1\times10^2$ Pa and equal to or less than $1\times10^5$ Pa. Since film formation with this apparatus is performed under the foregoing pressure, the evacuation means 310 preferably has high suction and evacuation capability. The switching valve 311 is provided between the evacuation means 310 and each of the treatment chambers and an evacuation speed can be controlled therewith.

The gas supply means 312 includes the cylinder 313, the valve 314, the mass flow controller 315, and the like. The cylinder 313 is filled with a gas for treatment such as a semiconductor material gas and a diluent gas. The gas supply means 312$p$ is connected to the first treatment chamber 302 and supplies a gas for a p-type semiconductor layer. The gas supply means 312$i$ is connected to the second treatment chamber 303 and supplies a gas for an i-type semiconductor layer. The gas supply means 312$n$ is connected to the third treatment chamber 304 and supplies a gas for an n-type semiconductor layer. The gas supply means 312$h$ supplies hydrogen, and the gas supply means 312$f$ supplies an etching gas which is used for cleaning the inside of the treatment chambers, and they are a line shared by the treatment chambers.

Each treatment chamber has the plasma generation means 305. The plasma generation means 305 includes an oscillator which generates plasma in the treatment chamber. For example, the plasma generation means 305 includes a microwave power supply, a microwave amplifier, a waveguide which carries microwave to the treatment chamber, and the like. Each treatment chamber has one or plurality of the plasma generation means 305. The number of plasma generation means 305 may be determined in accordance with a substrate to be treated so that a film which is formed over the substrate can be uniform.

With the in-line multi-chamber microwave plasma CVD apparatus in FIG. 8, a plurality of substrates to be treated can be treated successively.

In a plasma CVD apparatus having such a structure, a gas for treatment (a reactive gas) is supplied to the treatment chamber in which a substrate is placed and microwave is supplied into the treatment chamber through the slits of the waveguides which face the substrate. Then, plasma is generated to form a semiconductor layer of a microcrystalline semiconductor over the substrate.

In the case where a film of a microcrystalline semiconductor is formed using the plasma CVD apparatus having the above-described structure, it is preferable to use helium when plasma is generated in the treatment chamber. In other words, helium is preferably supplied before power for generating plasma is supplied. Helium has an ionization energy of 24.5 eV which is the highest ionization energy among all gases, but helium has a metastable state in a level of about 20 eV, which is slightly lower than the level of the ionization energy. Therefore, only about 4 eV, which is the difference of the levels between the ionization energy and the metastable state, is needed for ionization during discharge, whereby stable discharge kept. In addition, a breakdown voltage of helium is the lowest among all gases. In accordance with such characteristics, helium can hold plasma stably in discharge under an atmospheric pressure or a subatmospheric pressure. Further, since uniform plasma can be generated, a uniform film can be deposited even when the area of a substrate over which the microcrystalline semiconductor layer is deposited is increased.

In the case where a PIN junction is formed as a structure of the photoelectric conversion layer formed of semiconductor layers, a microwave plasma CVD apparatus preferably has treatment chambers for respective microcrystalline semiconductor layers. In this case, first, a first gas for treatment (a reactive gas) is supplied into the first treatment chamber 302 in which a substrate to be treated (which becomes a substrate over which a first electrode is formed) is placed, and microwave is supplied into the first treatment chamber 302 through a slit provided in the waveguides which face the substrate. Then, plasma is generated and a first microcrystalline semiconductor layer (a p-type semiconductor layer) is formed over the substrate. Next, the substrate is transferred from the first treatment chamber 302 to the second treatment chamber 303 without being exposed to air. A second gas for treatment (a reactive gas) is supplied into the second treatment chamber 303 in which the substrate is placed and microwave is supplied similarly to generate plasma, so that a second microcrystalline semiconductor layer (an i-type semiconductor layer) is formed over the first microcrystalline semiconductor layer. Thereafter, the substrate is transferred from the second treatment chamber 303 to the third treatment chamber 304 without being exposed to air. A third gas for treatment (a reactive gas) is supplied into the third treatment chamber 304 in which the substrate is placed and microwave is supplied the third treatment chamber 304 similarly to generate plasma so that a third microcrystalline semiconductor layer (an n-type semiconductor layer) is formed over the second microcrystalline semiconductor layer.

Alternatively, the p-type semiconductor layer, the i-type semiconductor layer, and the n-type semiconductor layer may be successively formed in a treatment chamber. In that case, in order to decrease the amount of p-type impurity contained in the i-type semiconductor layer, discharge may be stopped and a highly reactive gas such as silane may be made to flow to replace the atmosphere in the treatment chamber between formation of the p-type semiconductor layer and the i-type semiconductor layer. The inside of the treatment chamber is preferably cleaned after formation of each semiconductor layer in order to remove residue in the treatment chamber. The inside of the treatment chamber is preferably cleaned with the following plasma cleaning. After the plasma cleaning, a highly reactive gas such as silane may be made to flow to remove residue impurities in the treatment chamber.

The treatment chamber used for forming the semiconductor layer is subjected to plasma cleaning by supplying an etching gas. As an etching gas, nitrogen trifluoride ($NF_3$), sulfur hexafluoride ($SF_6$), or the like can be used. After the etching, in order to reduce influence of a remaining component such as fluorine remaining in the treatment chamber, the inner wall of the treatment chamber is preferably covered with a silicon film. The silicon film is formed by generating plasma by supplying a silane into the treatment chamber.

Note that the inner wall of the treatment chamber for forming a semiconductor layer containing impurity may be covered with an semiconductor film containing impurity. For example, the inner wall of the treatment chamber in which a p-type semiconductor layer is formed may be covered with a p-type semiconductor film. Thus, release of a gas from the wall of the treatment chamber can be reduced by covering the inner wall with a film of silicon or the like after plasma cleaning. In addition, by generating plasma by introduction of silane, oxygen, moisture, or the like remaining in the treatment chambers is reacted with silane and evacuated to the outside of the treatment chamber; therefore, the clean level in the treatment chambers can be improved. In a similar manner, by making silane flow into the treatment chamber before formation of each semiconductor layer, the clean level in the treatment chambers can be improved.

Note that the number of treatment chambers may be determined according to the number of layers to be stacked. For example, in the case of providing the $p^-$-type semiconductor layer 15 between the p-type semiconductor layer 14 and the i-type semiconductor layer 16 as illustrated in FIG. 1B, a treatment chamber may be additionally provided. In the case of forming the $p^-$-type semiconductor layer 15, the concentration of diborane which is supplied together with silane as a gas for treatment may be controlled to be about less than 1 ppm, or self doping may be utilized as an alternative method. Self doping refers to a method in which the inner wall of the treatment chamber is covered with a semiconductor containing a p-type impurity, and thus a minute amount of p-type impurity (such as boron) is contained in a film during film formation, so that $p^-$-type semiconductor layer 15 can be formed.

Figure 9:
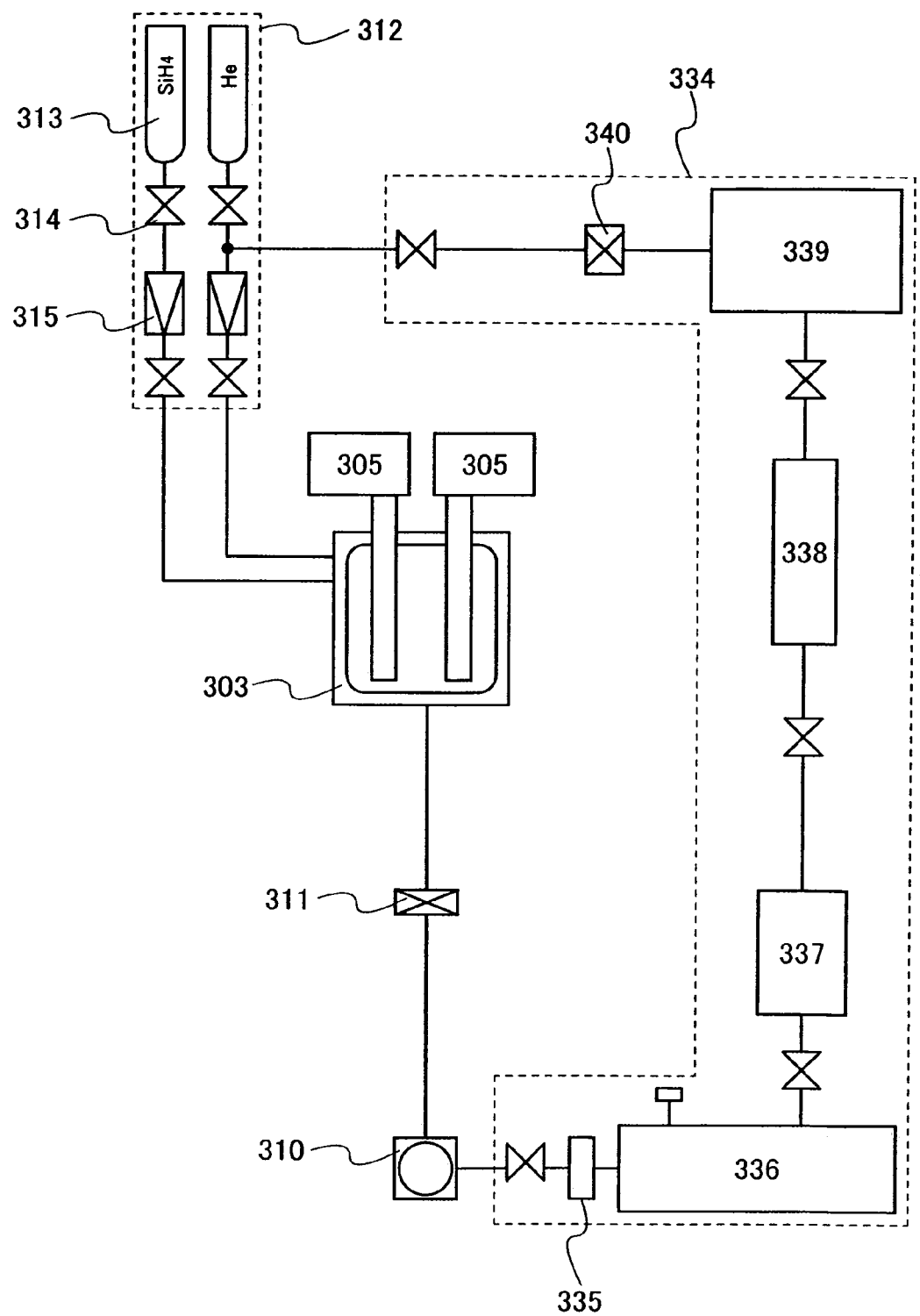
FIG. 9 illustrates a structure of a gas purification circulator in a plasma CVD apparatus.

A microcrystalline semiconductor layer is formed by mixing silane (in the case of adding an impurity to the microcrystalline semiconductor layer, a doping gas is additionally used) and hydrogen which is a diluent gas and/or a rare gas, and using high-density plasma. Since silane is diluted 10 to 2000 times with hydrogen and/or a rare gas, a large amount of hydrogen and/or the rare gas is needed. Accordingly, a gas which is supplied during film formation of the microcrystalline semiconductor film may be collected to be reused. FIG. 9 illustrates an example of a gas purification circulator 334 which is applied to a plasma CVD apparatus.

The gas purification circulator 334 collects and purifies a semiconductor material gas such as silane or a rare gas such as helium. A gas for treatment in the second treatment chamber 303 is suctioned by the evacuation means 310 which consists of a circulator and the like and is exhausted from the evacuation means 310 as a used gas. The used gas is stored in a collected gas container 336 after fine particles are removed therefrom with a filter 335. After the used gas is stored in the collected gas container 336, the gas is boosted by a booster 337, and only a rare gas such as helium in the gas is separated with a separator 338. As a system of the separator 338, film separation, adsorption separation, absorption separation, cryogenic separation, or the like can be applied. The gas that is separated and purified is stored in a filling container 339. The pressure of the gas stored in the filling container 339 is adjusted to be a predetermined pressure with a pressure controller 340 and then, supplied to an upper stream in the mass flow controller 315 of the gas supply means 312. Reusing the gas for treatment in such a manner can make it possible to reduce the consumption of a gas for treatment needed for the microcrystalline semiconductor. In other words, by reusing a rare gas such as helium, the consumption of energy for manufacture of the photoelectric conversion device can be reduced, and emission of carbon dioxide can be reduced.

A microcrystalline semiconductor film which is formed with such an apparatus can be deposited uniformly over a large substrate, and an integrated photoelectric conversion device in which a plurality of unit cells are connected in series over the substrate can be formed. The process is briefly described below.

FIGS. 10A and 10B and FIGS. 11A and 11B illustrate steps of manufacturing a photoelectric conversion device in which a plurality of photoelectric conversion unit cells are provided over a substrate with an insulating surface and the photoelectric conversion unit cells are connected in series over the substrate. A first electrode 12 is formed over a substrate 10. The first electrode 12 is separated into a plurality of insulated regions by openings $M_0$ to $M_n$ (FIG. 10A). The openings $M_0$ to $M_n$ are formed by forming a conductive film over an entire surface of the substrate 10, and then, etching the conductive film according to an opening pattern or directly processing the conductive film using an energy beam such as laser light. In the case where the conductive film, a semiconductor film, and an insulating film formed over the substrate 10, are processed by laser processing, the processing is preferably performed by concentrating laser light using an optical system for minute processing. In order to process a large substrate efficiently as described above, elongated opening patterns are formed by concentrating laser light into a linear shape and performing irradiation with pulsed laser light at one or plural times.

After forming the openings $M_0$ to $M_n$ in the first electrode 12, a semiconductor layer which is to serve as a photoelectric conversion layer is formed. FIG. 10A illustrates the case in which the p-type semiconductor layer 14, the i-type semiconductor layer 16, and the n-type semiconductor layer 18 are formed in that order from the first electrode 12 side. As for a structure of the photoelectric conversion layer, the structure illustrated in FIGS. 1A and 1B and FIGS. 2A and 2B can alternatively be employed. The photoelectric conversion layer is preferably formed with the multi-chamber microwave plasma CVD apparatus provided with a plurality of treatment chambers illustrated in FIG. 3. With a plasma CVD apparatus having such a structure, the photoelectric conversion layers can be successively formed without being exposed to air.

Openings $C_1$ to $C_n$ are formed in the photoelectric conversion layer (FIG. 10B). The openings $C_1$ to $C_n$ penetrate the p-type semiconductor layer 14, the i-type semiconductor layer 16, and the n-type semiconductor layer 18, and are formed so that top surfaces or side surfaces of the first electrodes 12 are exposed. The openings $C_1$ to $C_n$ are formed with a predetermined gap therebetween and are adjacent to the openings $M_0$ to $M_n$, respectively. This step can also be performed with laser processing.

Figure 11A:
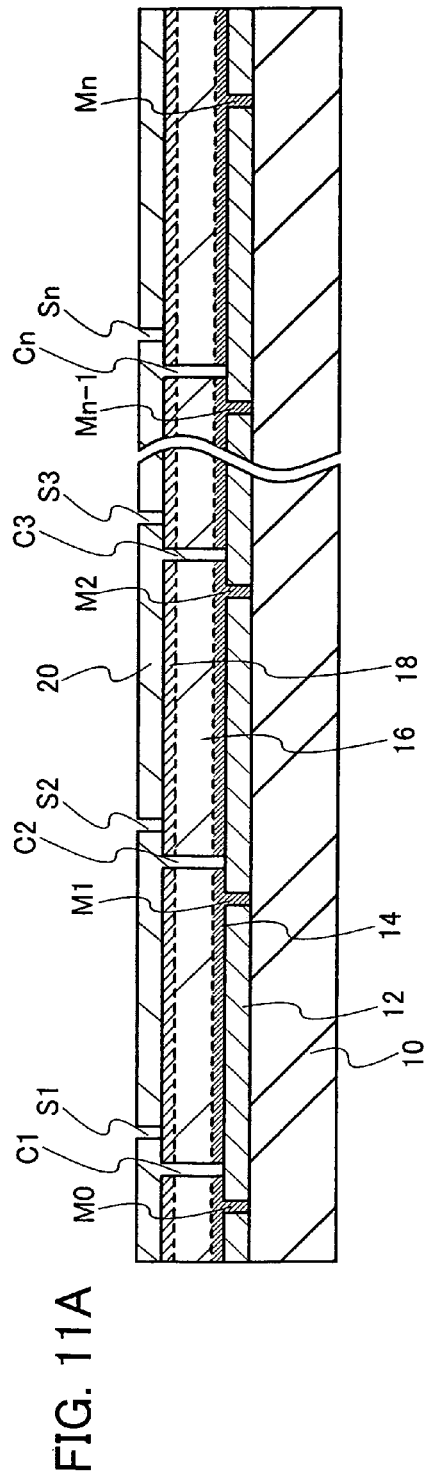
FIGS. 11A and 11B are cross-sectional views illustrating manufacturing steps of a photoelectric conversion device which uses a microcrystalline semiconductor for a photoelectric conversion layer.

A second electrode 20 is separated by openings $S_1$ to $S_n$ and is electrically connected to the first electrode 12 through the openings $C_1$ to $C_n$ (FIG. 11A). The openings $S_1$ to $S_n$ are formed with a predetermined gap therebetween and are adjacent to the openings $C_1$ to $C_n$. This step can also be performed with laser processing. In the case of performing laser processing, selective processing becomes easy when chromium having a sublimation property is used for the second electrode 20.

Accordingly, a plurality of unit cells each having the photoelectric conversion layer between the first electrode 12 and the second electrode 20 can be formed, and an integrated structure in which unit cells are connected in series with the adjacent unit cells can be obtained.

Figure 11B:
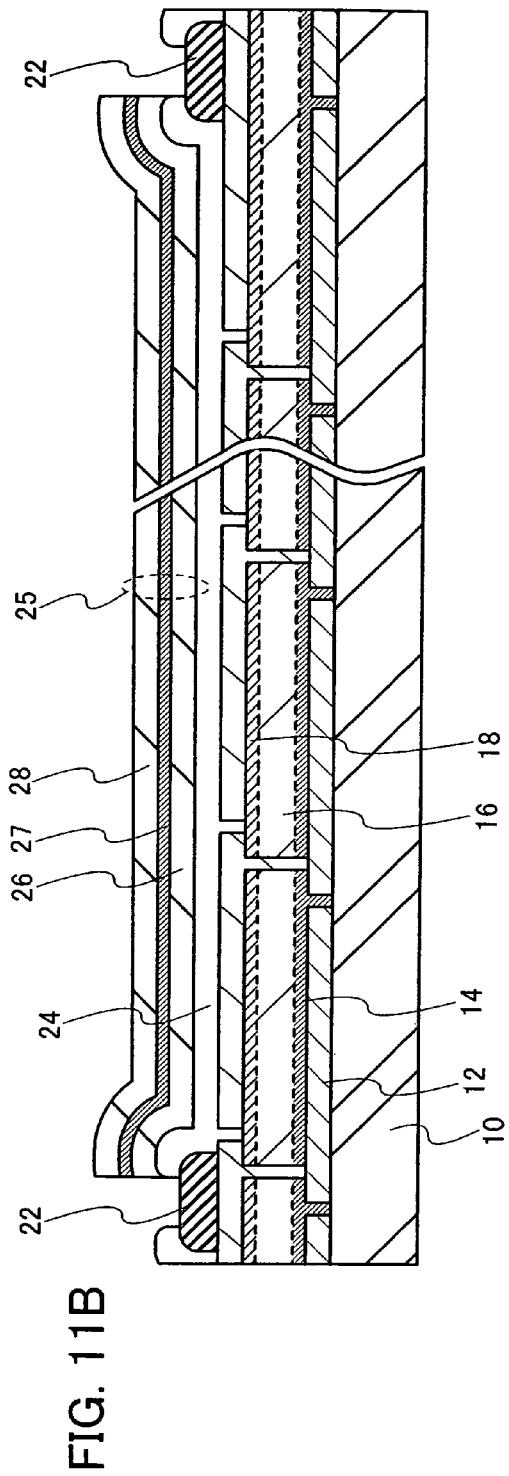

A structure is illustrated in which an extraction electrode 22 is provided over the second electrode 20 and is covered with a protective film 24, and a protective film 25 is provided thereover (FIG. 11B). The protective film 25 has a three-layer structure. A layer 26 of ethylene vinyl acetate (EVA) is an adhesive layer which is melted when being heated. An aluminum foil 27 is a layer for blocking moisture which prevents moisture vapor from entering from outside. An outer surface film 28 is formed using poly(ethylene terephthalate) (PET) or the like. As described above, a photoelectric conversion device in which a plurality of unit cells are connected to each other over the substrates 10 can be obtained.

Figure 12A:
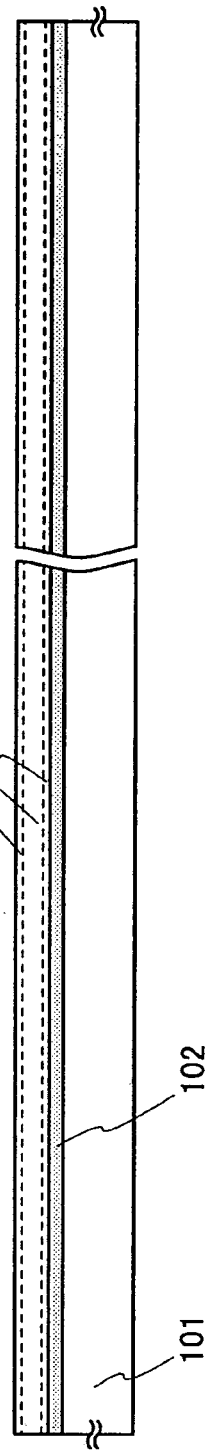
FIGS. 12A to 12C are cross-sectional views illustrating manufacturing steps of a photoelectric conversion device which uses a microcrystalline semiconductor for a photoelectric conversion layer.

Next, manufacturing steps in which an insulating pattern or a conductive pattern is formed by a printing method is described with reference to FIGS. 12A to 12C and FIG. 13. A light-transmitting electrode layer 102 is provided over a substrate 101, or a substrate provided with the light-transmitting electrode layer 102 is prepared (FIG. 12A). The light-transmitting electrode layer 102 is formed of an indium tin oxide alloy (ITO), zinc oxide (ZnO), tin oxide ($SnO_2$), an ITO-ZnO alloy, or the like to have a thickness of 40 nm to 200 nm (preferably 50 nm to 100 nm). The sheet resistance of the light-transmitting electrode layer 102 may be about 20 Ω/square to 200 Ω/square.

Alternatively, a conductive composition containing a conductive high molecule (also referred to as a conductive polymer) can be used for the light-transmitting electrode layer 102. When a thin film of a conductive composition is formed as the light-transmitting electrode layer 102, the thin film preferably has a sheet resistance of equal to or less than 10000 Ω/square and light transmittance of equal to or greater than 70% with respect to light with a wavelength of 550 nm. Note that resistance of a conductive high molecule which is contained in the conductive composition is preferably equal to or less than 0.1 Ω·cm. As a conductive high molecule, a so-called a π electron conjugated high-molecule can be used. For example, polyaniline and/or a derivative thereof, polypyrrole and/or a derivative thereof, polythiophene and/or a derivative thereof, and a copolymer of two or more kinds of those materials can be used.

Specific examples of the conjugated conductive high-molecule which can be used are given below: polypyrrole, poly (3-methylpyrrole), poly(3-butylpyrrole), poly(3-octylpyrrole), poly(3-decylpyrrole), poly(3,4-dimethylpyrrole), poly (3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly (N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), and poly(2-anilinesulfonic acid), and poly(3-anilinesulfonic acid).

Any of the foregoing conductive high molecules may be used alone as the conductive composition for the light-transmitting electrode layer. Alternatively, any of the foregoing conductive high molecules can be used with an organic resin added thereto to adjust characteristics of the conductive composition.

As for the organic resin, as long as the resin can be compatible to the conductive high molecule or mixed and dispersed into the conductive high molecule, a thermosetting resin, a thermoplastic resin, or a photocurable resin may be used. For example, a polyester-based resin such as poly(ethylene terephthalate), poly(butylene terephthalate), or poly (ethylene naphthalate); a polyimide-based resin such as polyimide or polyamide imide; a polyamide resin such as polyamide 6, polyamide 66, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or poly(vinyl chloride); an epoxy resin; a xylene resin; an aramid resin; a polyurethane-based resin; a polyurea-based resin; a melamine resin; a phenol-based resin; polyether; an acrylic-based resin; or a copolymer thereof can be used.

Further, the conductive composition may be doped with an acceptor dopant or a donor dopant so that oxidation-reduction potential of a conjugated electron in a conjugated conductive high-molecule may be changed in order to adjust conductivity of the conductive composition.

A halogen compound, a Lewis acid, a protonic acid, an organic cyano compound, an organometallic compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid are an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As an organic carboxylic acid and an organic sulfonic acid, the foregoing organic carboxylic acid compound and the foregoing organic sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, or tetracyanoazanaphthalene can be used.

As a donor dopant, alkali metal, alkaline-earth metal, a tertiary amine compound, or the like can be used.

The conductive composition is dissolved in water or an organic solvent (e.g., an alcohol-based solvent, a ketone-based solvent, an ester-based solvent, a hydrocarbon-based solvent, and an aromatic-based solvent) and a thin film which serves as a light-transmitting electrode layer can be formed by a wet process. A solvent which dissolves the conductive composition is not particularly limited and a solvent which dissolves the foregoing conductive high molecules and high molecular resin compounds such as an organic resin may be used. For example, the conductive composition may be dissolved in any one of or a mixture solvent of water, methanol, ethanol, propylene carbonate, N-methylpyrrolidone, dimethylformamide, dimethylacetamide, cyclohexanone, acetone, methyl ethyl ketone, methyl isobutyl ketone, or toluene.

After the conductive composition is dissolved in a solvent as described above, a film thereof can be formed by a wet process, such as an application method, a coating method, a droplet discharge method (also referred to as an inkjet method), or a printing method. The solvent may be dried with thermal treatment or may be dried under reduced pressure. In the case where the organic resin is a thermosetting resin, heat treatment may be further performed. In the case where the organic resin is a photocurable resin, light irradiation treatment may be performed.

Furthermore, the light-transmitting conductive layer 102 can be formed using a composite light-transmitting conductive material containing a hole-transporting organic compound and metal oxide which shows an electron accepting property with respect to the hole-transporting organic compound. In this composite light-transmitting conductive material, by compositing a hole-transporting organic compound and metal oxide which shows an electron accepting property with respect to the hole-transporting organic compound, resistivity can be equal to or less than $1\times10^6$ Ω·cm. Note that "composition" does not simply mean a state in which two materials are mixed, but also a state in which charges can be transported among a plurality of materials by mixing the plurality of materials.

The composite light-transmitting conductive material is obtained by combining a first organic compound and an inorganic compound. As the first organic compound used for the composite light-transmitting conductive material, various compounds such as an aromatic amine compound, a carbazole derivative, aromatic hydrocarbon, or a high molecular compound (e.g., an oligomer, a dendrimer, or a polymer) can be used. Note that, the first organic compound used for the composite material preferably is an organic compound having a high hole-transporting property. Specifically, it is preferable to use a substance having a hole mobility of greater than or equal to $1\times10^{-6}$ $cm^2$/Vsec. However, another substance may be used as long as it has a higher hole transporting property than an electron transporting property.

As the first organic compound used for the composite material, examples which can be used are given below. As the aromatic amine compound, 4,4'-bis[N-(1-naphthyl)-N-phenylamino]biphenyl (abbrev.: NPB), 4,4'bis[N-(3-methylphenyl)-N-phenylamino]biphenyl (abbrev.: TPD), 4,4',4"-tris(N,N-diphenylamino)triphenylamine (abbrev.: TDATA), 4,4',4"-tris[N-(3-methylphenyl)-N-phenylamino]triphenylamine (abbrev.: MTDATA), or the like can be used.

By using an organic compound given below, a composite material that does not have an absorption peak in a wavelength region of 450 nm to 800 nm can be obtained. In addition, at the same time, the resistivity can be equal to or less than $1\times10^6$ Ω·cm, typically, $5\times10^4$ Ω·cm to $1\times10^6$ Ω·cm.

As aromatic amine contained in the composite material that does not have an absorption peak in a wavelength region of 450 nm to 800 nm, the following can be given: N,N'-di(p-tolyl)-N,N'-diphenyl-p-phenylenediamine (abbrev.: DTDPPA), 4,4'-bis[N-(4-diphenylaminophenyl)-N-phenylamino]biphenyl (abbrev.: DPAB), 4,4'-bis(N-{4-[N-(3-methylphenyl)-N-phenylamino]phenyl}-N-phenylamino)biphenyl (abbrev.: DNTPD), 1,3,5-tris[N-(4-diphenylaminophenyl)-N-phenylamino]benzene (abbrev.: DPA3B), and the like.

As a carbazole derivative that can be used for the composite material that does not have an absorption peak in a wavelength region of 450 nm to 800 nm, the following can be specifically given: 3-[N-(9-phenylcarbazol-3-yl)-N-phenylamino]-9-phenylcarbazole (abbrev.: PCzPCA1), 3,6-bis[N-(9-phenylcarbazol-3-yl)-N-phenylamino]-9-phenylcarbazole (abbrev.: PCzPCA2), 3-[N-(1-naphthyl)-N-(9-phenylcarbazol-3-yl)amino]-9-phenylcarbazole (abbrev.: PCzPCN1), and the like.

Further, 4,4'-di(N-carbazolyl)biphenyl (abbrev.: CBP), 1,3,5-tris[4-(N-carbazolyl)phenyl]benzene (abbrev.: TCPB), 9-[4-(N-carbazolyl)]phenyl-10-phenylanthracene (abbrev.: CZPA), 2,3,5,6-triphenyl-1,4-bis[4-(N-carbazolyl)phenyl]benzene, or the like can be used.

As aromatic hydrocarbon that can be used for the composite material that does not have an absorption peak in a wavelength region of 450 nm to 800 nm, the following can be given for example: 9,10-di(naphthalen-2-yl)-2-tert-butylanthracene (abbrev.: t-BuDNA), 9,10-di(naphthalen-1-yl)-2-tert-butylanthracene, 9,10-bis(3,5-diphenylphenyl)anthracene (abbrev.: DPPA), 9,10-di(4-phenylphenyl)-2-tert-butylanthracene (abbrev.: t-BuDBA), 9,10-di(naphthalen-2-yl)anthracene (abbrev.: DNA), 9,10-diphenylanthracene (abbrev.: DPAnth), 2-tert-butylanthracene (abbrev.: t-BuAnth), 9,10-di(4-methylnaphthalen-1-yl)anthracene (abbrev.: DMNA), 2-tert-butyl-9,10-bis[2-(naphthalen-1-yl)phenyl]anthracene, 9,10-bis[2-(naphthalen-1-yl)phenyl]anthracene, 2,3,6,7-tetramethyl-9,10-di(naphthalen-1-yl)anthracene, 2,3,6,7-tetramethyl-9,10-di(naphthalen-2-yl)anthracene, 9,9'-bianthryl, 10,10'-diphenyl-9,9'-bianthryl, 10,10'-di(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl) perylene. Further, pentacene, coronene, or the like can be used. It is particularly preferable to use aromatic hydrocarbon which has a hole mobility of equal to or greater than $1\times10^{-6}$ $cm^2$/Vsec and which has 14 to 42 carbon atoms.

Note that aromatic hydrocarbon that can be used for the composite material that does not have an absorption peak in a wavelength region of 450 nm to 800 nm may have a vinyl skeleton. As aromatic hydrocarbon having a vinyl skeleton, the following can be given for example: 4,4'-bis(2,2-diphenylvinyl)biphenyl (abbrev.: DPVBi), 9,10-bis[4-(2,2-diphenylvinyl)phenyl]anthracene (abbrev.: DPVPA), and the like.

Further, a high molecular compound such as poly{4-[N-(4-diphenylamniphenyl)-N-phenyl]aminostyrene} (abbrev.: PStDPA), poly{4-[N-(9-carbazol-3-yl)-N-phenylamino]styrene} (abbrev.: PStPCA), poly(N-vinylcarbazole) (abbrev.: PVK), or poly(4-vinyltriphenylamine) (abbrev.: PVTPA) can be used.

As the inorganic compound used for the composite material, transition metal oxide is preferably used. Moreover, oxide of a metal belonging to Groups 4 to 8 in the periodic table is preferably used. Specifically, vanadium oxide, niobium oxide, tantalum oxide, chromium oxide, molybdenum oxide, tungsten oxide, manganese oxide, rhenium oxide are preferable because of their high electron accepting property. Among them, molybdenum oxide is especially preferable because it is stable in air and its hygroscopic property is low, and it can be easily treated.

Note that a method for manufacturing a layer containing the composite material may be any method, regardless of a wet process or a dry process. For example, the layer containing the composite material can be manufactured by co-evaporation of the above-mentioned organic compound and inorganic compound. Note that since molybdenum oxide is easily vaporized in vacuum, it is also preferable from the aspect of a manufacturing process, in the case of forming the layer containing the composite material by an evaporation method. Further, the layer containing the composite material can be manufactured by applying and baking a solution containing the above-mentioned organic compound and metal alkoxide. As a method for applying the solution, an ink-jet method, a spin-coating method, or the like can be used.

By selecting the kind of the organic compound contained in the composite material as appropriate, a composite material that does not have an absorption peak in a wavelength region of 450 nm to 800 nm can be obtained. Therefore, in the case of using the composite material in a light-emitting device, light emitted from a light emitting region is not absorbed but transmitted effectively, which leads to improvement in light extraction efficiency. Further, light from a backlight is not absorbed but transmitted effectively, which leads to improvement in light extraction efficiency. Furthermore, the layer containing the composite material has high resistance to bending. That is, the layer containing the composite material can be used favorably when a photoelectric conversion device is manufactured using a flexible substrate.

Although an ITO film is suitable for the light-transmitting electrode layer 102, an ITO film is easily damaged by plasma. However, in a microwave plasma CVD method in this embodiment mode, deterioration of an electrode material can be suppressed because the electron temperature is low. Needless to say, in order to prevent deterioration of the ITO film, it is effective to form a $SnO_2$ film or a ZnO film over an ITO film. A ZnO (ZnO:Ga) film containing gallium (Ga) at 1 wt % to 10 wt % has high light transmittance and is suitable for formation over the ITO film. As an example of a combination thereof, when the ITO film is formed to have a thickness of 50 nm to 60 nm and the ZnO:Ga film is formed thereover to have a thickness of 25 nm, it is possible to prevent deterioration of light transmittance, and a favorable light transmittance can be obtained. In this stacked film, sheet resistance of 120 $\Omega$/square to 150 $\Omega$/square is obtained.

A photoelectric conversion layer 103 is formed using a microcrystalline semiconductor manufactured by the above-described microwave plasma CVD method. A typical example of a microcrystalline semiconductor is a microcrystalline silicon semiconductor manufactured using a $SiH_4$ gas as a raw material, in addition to a microcrystalline silicon-germanium semiconductor or a microcrystalline silicon-carbide semiconductor. The photoelectric conversion layer 103 includes a semiconductor junction. In a microwave plasma CVD method in this embodiment mode, damage at each junction interface is suppressed because the electron temperature is low, and a photoelectric conversion layer having a favorable semiconductor junction can be formed.

FIG. 12A illustrates an example of the photoelectric conversion layer 103 in which a p-type semiconductor layer 103a, an i-type semiconductor layer 103b, and an n-type semiconductor layer 103c are stacked from the light-transmitting electrode layer 102 side. The thickness of the p-type semiconductor layer 103a can be 10 nm to 20 nm; the thickness of the i-type semiconductor layer 103b can be 0.1 µm to 10 µm, preferably 0.5 µm to 5 µm, and more preferably 1 µm to 3 µm; and the thickness of the n-type semiconductor layer 103c can be 20 nm to 60 nm.

Treatment for improving crystallinity by irradiating the microcrystalline semiconductor layers with laser light may be performed in a state where the p-type semiconductor layer 103a, the i-type semiconductor layer 103b, and the n-type semiconductor layer 103c are stacked, or a state where the p-type semiconductor layer 103a and the i-type semiconductor layer 103b are stacked. Laser light with which the microcrystalline semiconductor layers are irradiated can be ultraviolet light, visible light, or infrared light. As a laser oscillator capable of emitting ultraviolet light, visible light, or infrared light, an excimer laser oscillator of KrF, ArF, XeCl, Xe, or the like; a gas laser oscillator of He, He—Cd, Ar, He—Ne, HF, or the like; a solid-state laser oscillator in which a crystal of YAG, $GdVO_4$, $YVO_4$, YLF, $YAlO_3$, or the like is doped with Cr, Nd, Er, Ho, Ce, Co, Ti, or Tm; a semiconductor laser oscillator of GaN, GaAs, GaAlAs, InGaAsP, or the like; or a diode laser can be used. Typically, excimer laser light with a wavelength of equal to or less than 400 nm, the second harmonic or the third harmonic of a YAG laser is used. For example, pulse laser light with a repetition rate of about 10 Hz to 1000 Hz is used, the laser light is concentrated to be 100 $mJ/cm^2$ to 500 $mJ/cm^2$ with an optical system, and is delivered to scan a silicon film surface with an overlap rate of 90% to 95%. Further, it is preferable to use a solid-state laser capable of continuous oscillation and to use second to fourth harmonics of the fundamental wave are preferably applied. Typically, a second harmonic (532 nm) or a third harmonic (355 nm) of an Nd:$YVO_4$ laser (a fundamental wave of 1064 nm) may be applied. In the case of using a continuous wave laser, laser light emitted from a continuous wave $YVO_4$ laser of 10 W output power is converted into harmonics using a non-linear optical element. The harmonic may be emitted by setting $YVO_4$ crystals and a non-linear optical element in a resonator. Then, the laser light having a rectangular shape or an elliptical shape on an irradiated face is preferably formed by an optical system, and an object is irradiated with the laser light. At this time, an energy density of about 0.01 $MW/cm^2$ to 100 $MW/cm^2$ (preferably, 0.1 $MW/cm^2$ to 10 $MW/cm^2$) is necessary. The semiconductor film may be moved at about a rate of 10 cm/s to 2000 cm/s relatively with respect to the laser light and is irradiated.

When a PIN junction is formed of such a microcrystalline semiconductor material, an open circuit voltage of about 0.4 V to 1 V can be obtained. When a stacked structure (also referred to as a tandem structure) in which a plurality of photoelectric conversion layers are stacked by using this PIN junction as one unit of the photoelectric conversion layer is employed, the open circuit voltage can be increased.

Figure 12B:
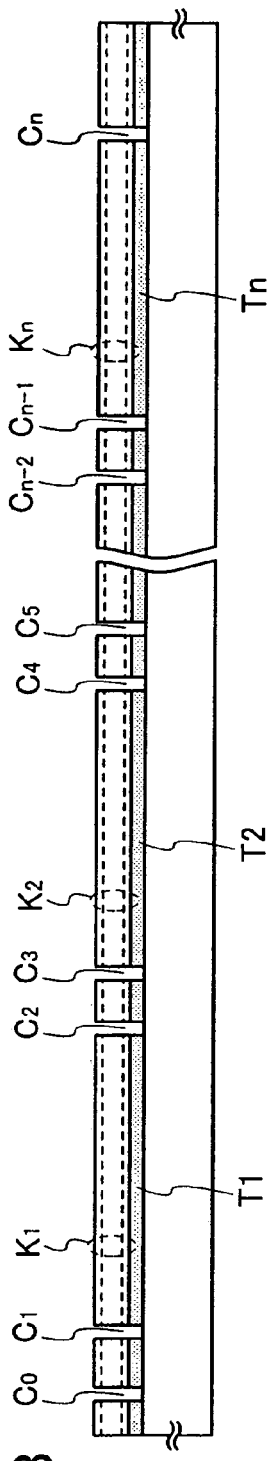

In order to form a plurality of unit cells over one substrate, openings $C_0$ to $C_n$ penetrating the photoelectric conversion layer 103 and the light-transmitting electrode layer 102 are formed by a laser processing method (FIG. 12B). The openings $C_0, C_2, C_4, \ldots, C_{n-2}$, and $C_n$ are openings for insulation and provided for forming unit cells, while the openings $C_1, C_3, C_5, \ldots, C_{n-1}$ are openings for connection between the light-transmitting electrode and a rear electrode. By carrying out laser processing in a state in which the light-transmitting electrode layer 102 and the photoelectric conversion layer 103 are stacked, separation of the light-transmitting electrode layer from the substrate in processing can be prevented.

Figure 12C:
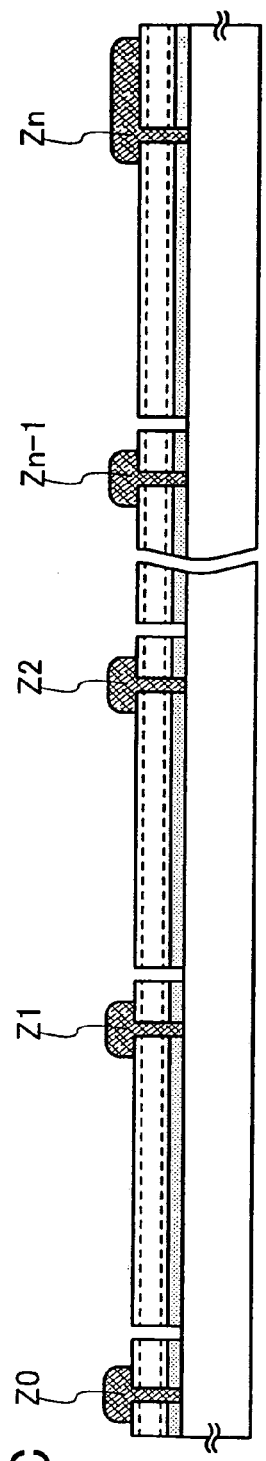

The light-transmitting electrode layer 102 is divided into light-transmitting electrodes $T_1$ to $T_n$, the photoelectric conversion layer 103 is divided into $K_1$ to $K_n$, the openings $C_0, C_2, C_4, \ldots, C_{n-2}$, and $C_n$ are filled, and insulating resin layers $Z_0$ to $Z_n$ covering upper end portions of the openings $C_0, C_2, C_4, \ldots, C_{n-2}$, and $C_n$, are formed (FIG. 12C). The insulating resin layers $Z_0$ to $Z_n$ may be formed using an insulating resin material such as an acrylic-based resin, a phenol-based resin, an epoxy-based resin, or a polyimide-based resin by a screen printing method. For example, insulating resin patterns are formed by a screen printing method so that the openings $C_0, C_2, C_4, \ldots, C_{n-2}$, and $C_n$ are filled with a resin composition in which at least one of cyclohexane, isophorone, high resistance carbon black, aerosil, a dispersing agent, a defoaming agent, and a leveling agent are mixed with a phenoxy resin. After the printed patterns are formed, thermal hardening is performed in an oven for 20 minutes at 160° C. to obtain the insulating resin layers $Z_0$ to $Z_n$.

Figure 13:
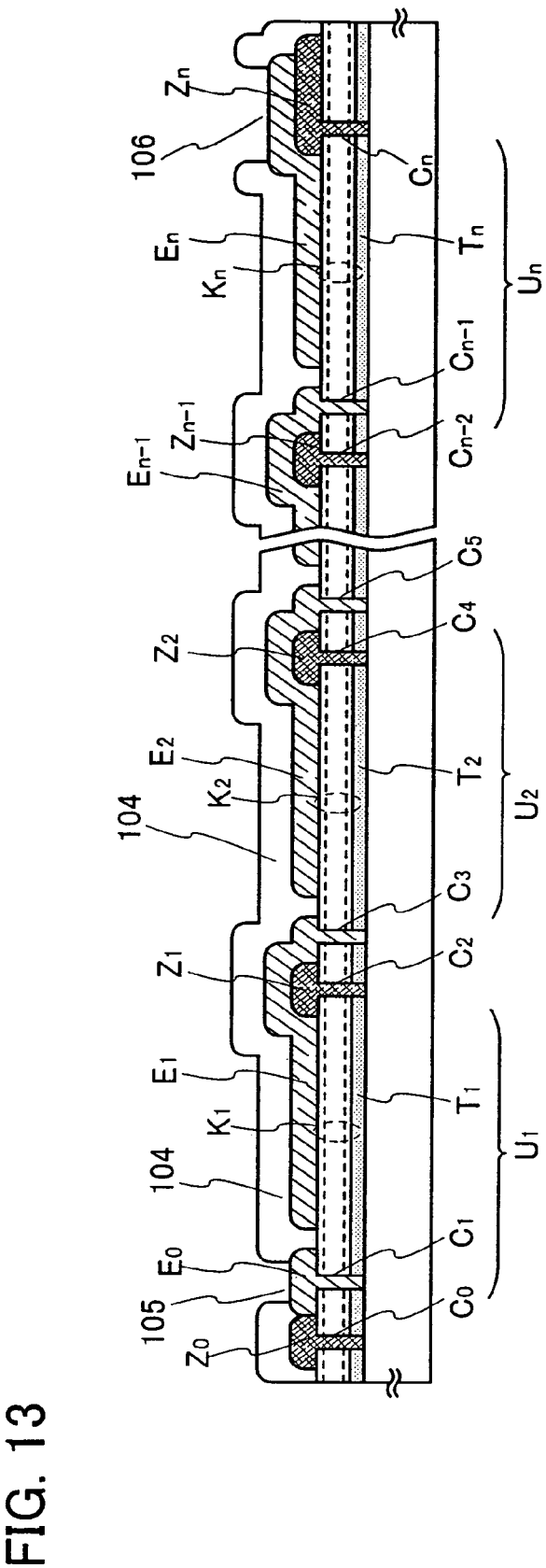
FIG. 13 is a cross-sectional view illustrating a manufacturing step of a photoelectric conversion device which uses a microcrystalline semiconductor for a photoelectric conversion layer.

Next, rear electrodes $E_0$ to $E_n$ are formed. The rear electrodes $E_0$ to $E_n$ are formed of a conductive material (FIG. 13). In this case, the rear electrodes $E_0$ to $E_n$ may be a layer formed of aluminum, silver, molybdenum, titanium, chromium, or the like by a sputtering method or a vacuum evaporation method. Alternatively, the rear electrodes $E_0$ to $E_n$ can be formed using a conductive resin material. In the case where the rear electrodes $E_0$ to $E_n$ are formed using a conductive resin material, predetermined patterns may be directly formed by a screen printing method, an ink-jet method (droplet discharge method), a dispenser method, or the like. As a conductive composition, a composition containing particles of metal such as Ag (silver), Au (gold), Cu (copper), W (tungsten), or Al (aluminum) as its main component can be used. In the case where a photoelectric conversion device is manufactured using a large substrate, it is preferable that resistance of the rear electrodes $E_0$ to $E_n$ be lowered. Therefore, a composition in which conductive particles of any of gold, silver, or copper, which has low resistance, is dissolved or dispersed as a main material in a solvent is preferably used. More preferably, silver or copper, which has low resistance, may be used. In addition, in order to fill the openings $C_1$, $C_3$, $C_5$, ..., $C_{n-1}$ which are laser processed with a conductive material sufficiently, a nanopaste with an average grain size of conductive particles of 5 nm to 10 nm is preferably used.

Alternatively, the rear electrodes $E_0$ to $E_n$ may be formed by discharging a composition containing particles which are formed of a conductive material and are covered with another conductive material. For example, a particle formed of Cu which is covered with Ag, and is provided with a buffer layer formed of Ni or NiB (nickel boron) between Cu and Ag may be used. As for a solvent, an organic solvent like esters such as butyl acetate, alcohols such as isopropyl alcohol, acetone, or the like is used. The surface tension and the viscosity are adjusted as appropriate by controlling a concentration of a solution and by adding a surface active agent or the like.

A diameter of a nozzle used for an ink-jet method is preferably 0.02 μm to 100 μm (more preferably, equal to or less than 30 μm), and the amount of discharge of a composition discharged from the nozzle is preferably 0.001 pl to 100 pl (more preferably, equal to or less than 10 pl). There are two types of a droplet discharge method, an on-demand type and a continuous type, and either of them may be used. Further, as for a nozzle used for an ink-jet method, there are a piezoelectric type utilizing a property of a piezoelectric substance that the shape of the substance changed by voltage application and a heating type in which a composition is boiled by a heater provided in the nozzle to be discharged, and either of them may be used. The distance between an object to be treated and a discharging opening of the nozzle be as short as possible in order to drop a droplet onto a desired place. The distance is preferably about 0.1 mm to 3 mm (more preferably, equal to or less than 1 mm). One of the nozzle and the object to be treated moves while keeping the distance between therebetween so that a desired pattern is drawn.

A step of discharging the conductive composition may be performed under a reduced pressure because the solvent of the composition is volatilized before the discharged composition reaches the object to be treated, and thus, subsequent steps of drying and baking can be omitted or shortened. In addition, by actively using a gas in which oxygen has a partial pressure ratio of 10% to 30% in a baking step of the composition containing a conductive material, resistivity of a conductive film which forms the rear electrodes $E_0$ to $E_n$ can be reduced, and the conductive film can be thinned and planarized.

After the composition is discharged, either one or both a drying step and a baking step are performed under a normal pressure or a reduced pressure by laser light irradiation, rapid thermal annealing, heating using a heating furnace or the like. Both the drying and baking steps are heat treatment, but for example, drying is performed for three minutes at 100° C. and baking is performed for 15 to 120 minutes at a temperature of 200° C. to 350° C. Through this step, the solvent in the composition is volatilized or the dispersing agent is chemically removed, so that fusion and welding of conductive particles are accelerated by hardening and shrinking of a resin therearound. This step is performed under an oxygen atmosphere, a nitrogen atmosphere, or the atmospheric air. However, an oxygen atmosphere is preferable because a solvent in which a metal element is dissolved or dispersed is easily removed.

Nanopaste has conductive particles having a grain diameter of 5 nm to 10 nm which are dispersed or dissolved in an organic solvent, and a dispersing agent and a thermal curing resin which is referred to as a binder are also included. A binder has a function of preventing crack or uneven baking during baking. By a drying step or a baking step, evaporation of the organic solvent, decomposition or removal of the dispersing agent, and hardening shrinking by the binder are concurrently proceed; accordingly, nanoparticles are fused and/or welded to each other to be cured. At that time, the nanoparticles grow to be several tens of nanometers to a hundred and several tens of nanometers. Adjacent growing particles are fused and/or welded to each other to be linked, so that a metal chain is formed. On the other hand, most of remaining organic constituents (about 80% to 90%) are pushed out of the metal chain; consequently, a conductive film containing the metal chain and a film containing the organic constituent that covers the outer surface of the conductive film are formed. The film containing the organic constituent can be removed in baking a nanopaste under an atmosphere containing nitrogen and oxygen due to reaction of oxygen contained in air and carbon, hydrogen, or the like in the film containing the organic constituent. In addition, in the case where oxygen is not contained in a baking atmosphere, the film containing the organic constituent can be removed separately with oxygen plasma treatment or the like. As described above, the film containing the organic constituent is removed by baking the nanopaste under an atmosphere containing nitrogen and oxygen or performing oxygen plasma treatment after drying; therefore, smoothing, thinning, and reducing resistance of a conductive film are possible. Note that, since a solvent in a composition is volatilized by discharging the composition containing a conductive material under a reduced pressure, a period of time of subsequent heat treatment (drying or baking) can be shortened.

Such rear electrodes are in contact with the n-type semiconductor layer $103c$ of the photoelectric conversion layer. This contact is ohmic contact. In order to further reduce the contact resistance, the n-type semiconductor layer $103c$ may be formed of a microcrystalline semiconductor. The thickness of the n-type semiconductor layer $103c$ can be 30 nm to 80 nm.

The rear electrodes $E_0$ to $E_n$ are formed to be connected to the light-transmitting electrodes $T_1$ to $T_n$ through the openings $C_1$, $C_3$, $C_5$, ..., $C_{n-1}$, respectively. That is, the openings $C_1$, $C_3$, $C_5$, ..., $C_{n-1}$ are filled with the same material as the rear electrodes. In such a manner, the rear electrode $E_1$ can be electrically connected to the light-transmitting electrode $T_2$, for example, and the rear electrode $E_{n-1}$ can be electrically connected to the light-transmitting electrode $T_n$. In other words, each of the rear electrodes can be electrically connected to the adjacent light-transmitting electrode, and whereby photoelectric conversion layers $K_1$ to $K_n$ can be electrically connected in series.

A sealing resin layer 104 is formed using an epoxy resin, an acrylic resin, or a silicone resin. In the sealing resin layer 104, openings 105 and 106 are formed over the rear electrodes $E_0$ and $E_n$, respectively, and the rear electrodes $E_0$ and $E_n$ can be connected to an external wiring in the openings 105 and 106.

Accordingly, a unit cell $U_n$ including the light-transmitting electrode $T_n$, the photoelectric conversion layer $K_n$, and the rear electrode $E_n$ is formed over the substrate 101. The light-transmitting electrode $T_n$ is connected to the rear electrode $E_{n-1}$ adjacent to the light-transmitting electrode $T_n$ in the opening $C_{n-1}$. Thus, a photoelectric conversion device provided with n units which are electrically connected in series can be manufactured. The rear electrode $E_0$ serves as an extraction electrode of the light-transmitting electrode $T_1$ in a unit cell $U_1$.

FIGS. 14A to 14C and FIG. 15 illustrate another mode of a photoelectric conversion device. The substrate 101, the light-transmitting electrode layer 102, and the photoelectric conversion layer 103 are formed as described above (FIG. 14A). Then, the rear electrodes $E_1$ to $E_n$ are formed by a printing method over the photoelectric conversion layer 103.

Figure 14:
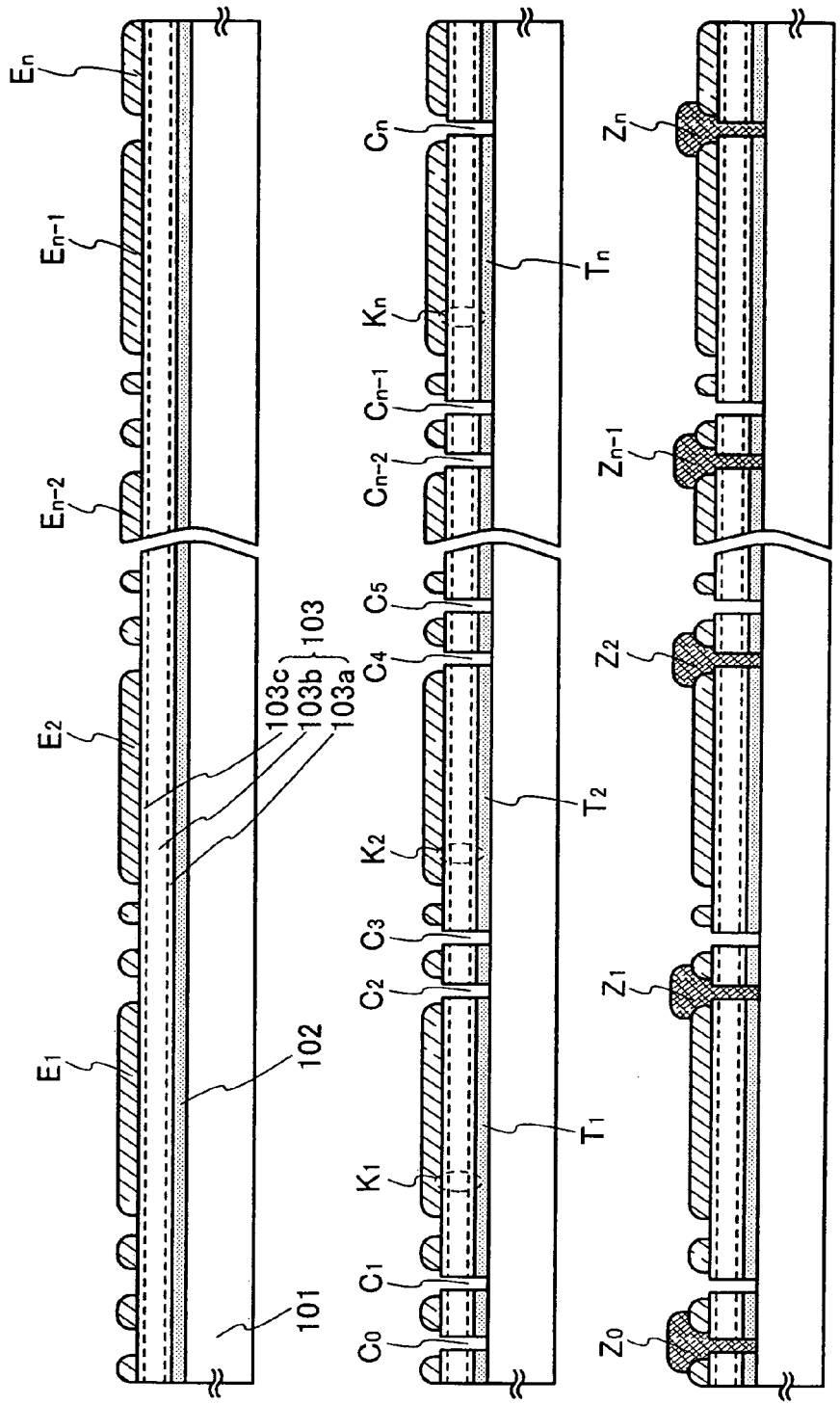
FIGS. 14A to 14C are cross-sectional views illustrating manufacturing steps of a photoelectric conversion device which uses a microcrystalline semiconductor for a photoelectric conversion layer.

Then, the openings $C_0$ to $C_n$ penetrating the photoelectric conversion layer 103 and the light-transmitting electrode layer 102 are formed by a laser processing method (FIG. 14B). The openings $C_0, C_2, C_4, \ldots, C_{n-2}$, and $C_n$ are openings for insulation and provided for forming unit cells, while the openings $C_1, C_3, C_5, \ldots, C_{n-1}$ are openings for connection between the light-transmitting electrode and the rear electrode. In laser processing, residue may be left in the periphery of the openings. This residue is a spray of a material subjected to processing and undesirable because the spray heated up to a high temperature by laser light and attaches to the surface of the photoelectric conversion layer 103 so as to damage the film. In order to prevent this, the rear electrodes are formed according to patterns of the openings and then laser processing is performed; accordingly, damage at least to the photoelectric conversion layer 103 can be prevented.

The light-transmitting electrode layer 102 is divided into the light-transmitting electrodes $T_1$ to $T_n$, and the photoelectric conversion layer 103 is divided into $K_1$ to $K_n$; thereafter, the openings $C_0, C_2, C_4, \ldots, C_{n-2}$, and $C_n$ are filled. Then, the insulating resin layers $Z_0$ to $Z_n$ covering upper end portions of the openings $C_0, C_2, C_4, \ldots, C_{n-2}$, and $C_n$, are formed by a printing method such as a screen printing method (FIG. 14C).

Figure 15:
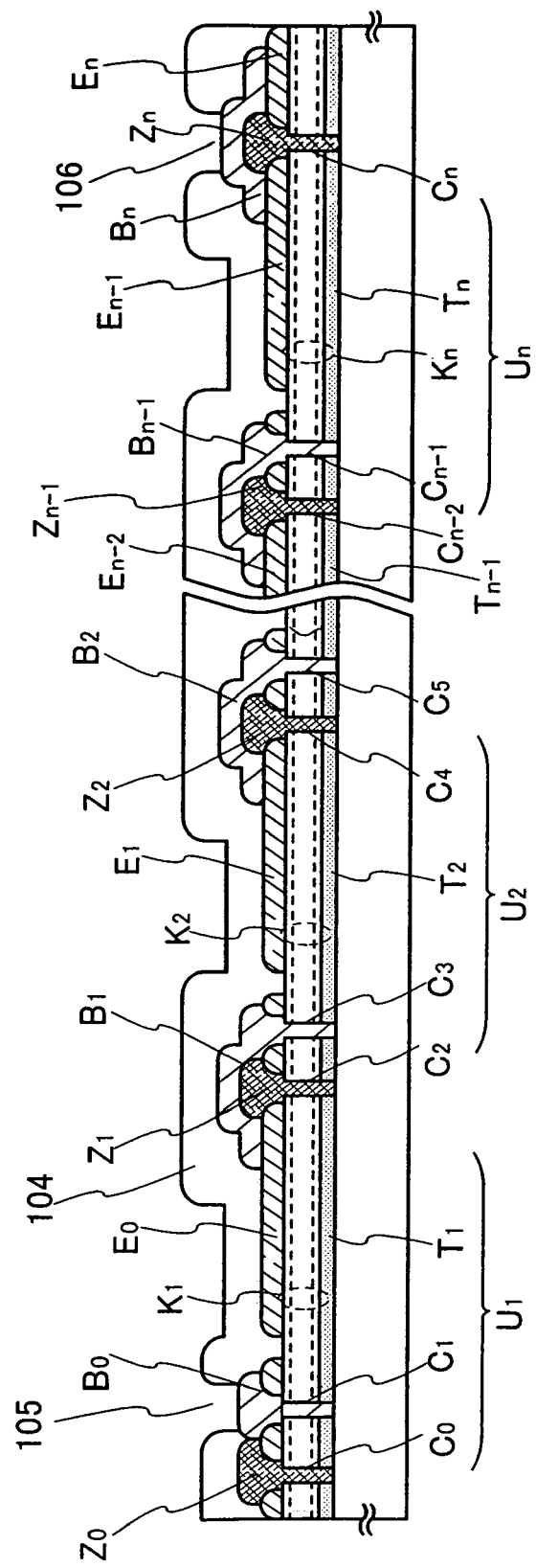
FIG. 15 is a cross-sectional view illustrating a manufacturing step of a photoelectric conversion device which uses a microcrystalline semiconductor for a photoelectric conversion layer.

Next, the openings $C_1, C_3, C_5, \ldots, C_{n-1}$ are filled as illustrated in FIG. 15, and wirings $B_0$ to $B_{n-1}$ which are connected to the light-transmitting electrodes $T_1$ to $T_n$ are formed by a screen printing method. The wirings $B_0$ to $B_n$ are formed of the same material as the rear electrodes, and a thermosetting carbon paste is used here. Note that the wiring $B_n$ is formed over the insulating resin layer $Z_n$ and serves as an extraction wiring. In such a manner, the rear electrode $E_0$ can be electrically connected to the light-transmitting electrode $T_2$, for example, and the rear electrode $E_{n-2}$ can be electrically connected to the light-transmitting electrode $T_n$. In other words, each of the rear electrodes can be electrically connected to the adjacent light-transmitting electrode, and the photoelectric conversion layers $K_1$ to $K_n$ can be electrically connected in series.

Then, the sealing resin layer 104 is formed by a printing method. In the sealing resin layer 104, the openings 105 and 106 are formed over the wirings $B_0$ and $B_n$, respectively, and the wirings are connected to an external circuit in these openings. Accordingly, a unit cell $U_n$ including the light-transmitting electrode $T_n$, the photoelectric conversion layer $K_n$, and the rear electrode $E_{n-1}$ is formed over the substrate 101. The light-transmitting electrode $T_n$ is connected to the rear electrode $E_{n-2}$ which is adjacent thereto through the opening $C_{n-1}$ whereby a photoelectric conversion device provided with n units which are electrically connected in series can be manufactured. Note that the wiring $B_0$ serves as an extraction electrode of the light-transmitting electrode $T_1$ in the unit cell $U_1$.

In the photoelectric conversion device according to the present invention, at least one of the photoelectric conversion layers is formed of a microcrystalline semiconductor. Therefore, a photoelectric conversion device in which deterioration in characteristics due to light deterioration hardly occurs can be obtained.

Figure 16:
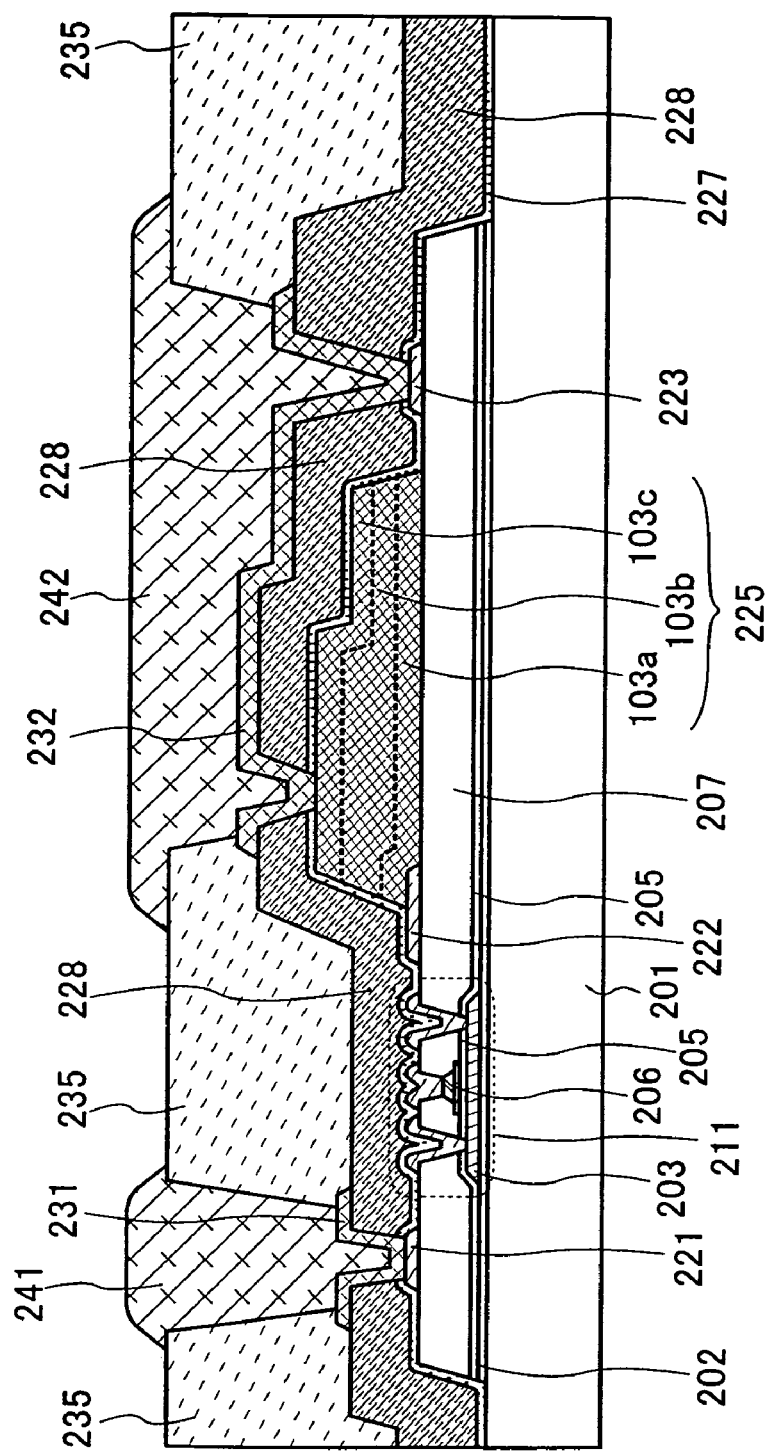
FIG. 16 illustrates an optical sensor device using a microcrystalline semiconductor for a photoelectric conversion layer.

FIG. 16 illustrates an optical sensor device as another mode of a photoelectric conversion device. This optical sensor device has a photoelectric conversion layer 225 in a light receiving portion and a function of amplifying an output from the photoelectric conversion layer 225 and outputting the output by an amplifier circuit including a thin film transistor 211. The photoelectric conversion layer 225 and the thin film transistor 211 are provided over a substrate 201. As the substrate 201, a light-transmitting substrate can be used, for example any of a glass substrate, a quartz substrate, or a ceramic substrate can be used.

An insulating layer 202 including one or more layer of silicon oxide, silicon nitride oxide, silicon nitride, or silicon oxynitride is formed over the substrate 201 by a sputtering method or a plasma CVD method. The insulating layer 202 is provided for relieving stress and preventing impurity contamination. A crystalline semiconductor layer 203 which is included in the thin film transistor 211 is provided over the insulating layer 202. A gate insulating layer 205 and a gate electrode 206 are provided over the crystalline semiconductor layer 203 and form the thin film transistor 211.

An interlayer insulating layer 207 is provided over the thin film transistor 211. The interlayer insulating layer 207 may be formed of a single insulating film or a laminate of insulating layers of different materials. Wirings electrically connected to a source region and a drain region of the thin film transistor 211 are formed over the interlayer insulating layer 207. In addition, over the interlayer insulating layer 207, an electrode 221, an electrode 222, and an electrode 223 which are formed of the same material and the same steps as the wiring are formed. The electrodes 221 to 223 are formed using a metal film, for example, a low resistance metal film. As such a low resistance metal film, an aluminum alloy, aluminum, or the like can be used. Alternatively, the electrodes 221 to 223 may have a laminate structure of such a low resistance metal film and a high-melting-point metal film; for example, a three-layer structure of a titanium film, an aluminum film, and a titanium film which are stacked in that order may be employed. In stead of a laminate structure of the high-melting-point metal film and the low resistance film, the electrodes 221 to 223 can be formed of a single conductive film. Such a single-layer conductive film may be formed of a single-layer film of an element selected from titanium, tungsten, tantalum, molybdenum, neodymium, cobalt, zirconium, zinc, ruthenium, rhodium, palladium, osmium, iridium, or platinum; a single-layer film using an alloy material or a compound material containing the above-mentioned element as its main component; or a single-layer film of nitride of the above-mentioned element, such as titanium nitride, tungsten nitride, tantalum nitride, or molybdenum nitride.

The interlayer insulating layer 207, the gate electrode layer 205, and the insulating layer 202 are etched so as to have tapered end portions. By processing the end portions of the interlayer insulating layer 207, the gate insulating layer 205, and the insulating layer 202 into a tapered shape, coverage of a protective layer 227 which is formed over these insulating layers are improved; therefore, moisture, impurities, and the like hardly enter the insulating layers.

The p-type semiconductor layer 103$a$, the i-type semiconductor layer 103$b$, and the n-type semiconductor layer 103$c$ are formed over the interlayer insulating layer 207. Note that the p-type semiconductor layer 103$a$ is at least partly in contact with the electrode 222. The p-type semiconductor layer 103$a$, the i-type semiconductor layer 103$b$, and the n-type semiconductor layer 103$c$ are similar to those described with reference to FIGS. 12A to 12C, FIG. 13, FIGS. 14A to 14C, and FIG. 15. The protective layer 227 is formed of, for example, silicon nitride over the photoelectric conversion layer 225. The protective layer 227 can prevent moisture and impurities such as organic substances from being mixed into the thin film transistor 211 and the photoelectric conversion layer 225. An interlayer insulating layer 228 is formed of an organic resin material such as polyimide or acryl over the protective layer 227. An electrode 231 and an electrode 232 are provided over the interlayer insulating layer 228. The electrode 231 is electrically connected to the electrode 221. The electrode 232 is electrically connected to an upper layer of the photoelectric conversion layer 225 (the n-type semiconductor layer 103c) and the electrode 223 through a contact hole formed in the interlayer insulating layer 228 and the protective layer 227. As the electrodes 231 and 232, tungsten, titanium, tantalum, silver, or the like can be used.

An interlayer insulating layer 235 is provided over the interlayer insulating layer 228 by a screen method or an ink-jet method, using an organic resin material such as an epoxy resin, polyimide, acryl, or a phenol resin. The interlayer insulating layer 235 has openings over the electrode 231 and the electrode 232. Over the interlayer insulating layer 235, an electrode 241 which is electrically connected to the electrode 231 and an electrode 242 which is electrically connected to the electrode 232 are provided by, for example, a printing method using a nickel paste.

Such a photoelectric conversion device serving as an optical sensor has a photoelectric conversion layer formed of a microcrystalline semiconductor. Therefore, a photoelectric conversion device in which deterioration in characteristics due to light deterioration hardly occurs can be obtained. FIG. 16 illustrates the optical sensor device in which the photoelectric conversion layer 225 is provided in the light receiving portion and an output from the photoelectric conversion layer 225 is amplified and output by the amplifier circuit including the thin film transistor 211. Note that if the structure of the amplifier circuit is omitted, the device can be used as an optical sensor.

This application is based on Japanese Patent Application serial no. 2007-195641 filed with Japan Patent Office on Jul. 7, 2007, the entire contents of which are hereby incorporated by reference.

What is claimed is:

1. A method for manufacturing a photoelectric conversion device comprising:
   supplying a reactive gas containing helium to a treatment chamber having a plurality of waveguides which are juxtaposed so as to be projected in a comb-shape; and
   forming a photoelectric conversion layer of a microcrystalline semiconductor over a substrate placed in the treatment chamber by supplying a microwave to space sandwiched between the plurality of waveguides to generate plasma, while maintaining a pressure in the treatment chamber at equal to or greater than $1 \times 10^2$ Pa and equal to or less than $1 \times 10^5$ Pa.

2. The method for manufacturing a photoelectric conversion device according to claim 1,
   wherein the plasma has an electron density of equal to or greater than $1 \times 10^{11}$ cm$^{-3}$ and equal to or less than $1 \times 10^{13}$ cm$^{-3}$, and an electron temperature of equal to or greater than 0.2 eV and equal to or less than 2.0 eV.

3. The method for manufacturing a photoelectric conversion device according to claim 1,
   wherein the plurality of waveguides are juxtaposed for one substrate,
   wherein a slit is placed on a side of each of the plurality of waveguides which faces another waveguide,
   wherein the microwave is supplied through the slit, and
   wherein the plasma is generated by the microwave.

4. The method for manufacturing a photoelectric conversion device according to claim 1,
   wherein the reactive gas contains helium and a semiconductor material gas,
   wherein a plurality of nozzles is provided in the treatment chamber, and
   wherein the helium is made to flow from one of the plurality of nozzles and the semiconductor material gas is made to flow from another one of the plurality of nozzles.

5. The method for manufacturing a photoelectric conversion device according to claim 1, wherein the photoelectric conversion device is a photovoltaic system.

6. A method for manufacturing a photoelectric conversion device comprising:
   supplying a reactive gas containing helium to a first treatment chamber having a plurality of waveguides which is juxtaposed so as to be projected in a comb-shape;
   forming a first photoelectric conversion layer of a microcrystalline semiconductor over a substrate placed in the first treatment chamber by supplying a microwave to space sandwiched between the plurality of waveguides to generate plasma, while maintaining a pressure in the first treatment chamber at equal to or greater than $1 \times 10^2$ Pa and equal to or less than $1 \times 10^5$ Pa;
   transferring the substrate from the first treatment chamber into a second treatment chamber having a plurality of waveguides which is juxtaposed so as to be projected in a comb-shape without exposing the substrate to air;
   supplying a reactive gas containing helium to the second treatment chamber;
   forming a second photoelectric conversion layer of a microcrystalline semiconductor over the first photoelectric conversion layer placed in the second treatment chamber by supplying a microwave to space sandwiched between the plurality of waveguides to generate plasma, while maintaining a pressure in the second treatment chamber at equal to or greater than $1 \times 10^2$ Pa and equal to or less than $1 \times 10^5$ Pa;
   transferring the substrate from the second treatment chamber into a third treatment chamber having a plurality of waveguides which is juxtaposed so as to be projected in a comb-shape without exposing the substrate to air;
   supplying a reactive gas containing helium to the third treatment chamber; and
   forming a third photoelectric conversion layer of a microcrystalline semiconductor over the second photoelectric conversion layer placed in the third treatment chamber by supplying a microwave to space sandwiched between the plurality of waveguides to generate plasma, while maintaining a pressure in the third treatment chamber at equal to or greater than $1 \times 10^2$ Pa and equal to or less than $1 \times 10^5$ Pa.

7. The method for manufacturing a photoelectric conversion device according to claim 6,
   wherein the plasma has an electron density of equal to or greater than $1 \times 10^{11}$ cm$^{-3}$ and equal to or less than $1 \times 10^{13}$ cm$^{-3}$, and an electron temperature of equal to or greater than 0.2 eV and equal to or less than 2.0 eV.

8. The method for manufacturing a photoelectric conversion device according to claim 6,
   wherein the plurality of waveguides is juxtaposed for one substrate,
   wherein a slit is placed on a side of each of the plurality of waveguides which faces another waveguide,
   wherein the microwave is supplied through the slit, and
   wherein the plasma is generated by the microwave.

9. The method for manufacturing a photoelectric conversion device according to claim 6, wherein the reactive gas contains helium and a semiconductor material gas, wherein a plurality of nozzles is provided in each of the first to third treatment chambers, and wherein the helium is made to flow from one of the plurality of nozzles and the semiconductor material gas is made to flow from another one of the plurality of nozzles in each of the first to third treatment chambers.

10. The method for manufacturing a photoelectric conversion device according to claim 6, wherein the photoelectric conversion device is a photovoltaic system.

11. A method for manufacturing a semiconductor device comprising:

supplying a reactive gas containing helium to a treatment chamber having a plurality of waveguides which is juxtaposed so as to be projected in a comb-shape; and forming a semiconductor layer of a microcrystalline semiconductor over a substrate placed in the treatment chamber by supplying a microwave to space sandwiched between the plurality of waveguides to generate plasma, while maintaining a pressure in the treatment chamber at equal to or greater than $1\times10^2$ Pa and equal to or less than $1\times10^5$ Pa.

12. The method for manufacturing a semiconductor device according to claim 11, wherein the plasma has an electron density of equal to or greater than $1\times10^{11}$ cm$^{-3}$ and equal to or less than $1\times10^{13}$ cm$^3$, and an electron temperature of equal to or greater than 0.2 eV and equal to or less than 2.0 eV.

13. The method for manufacturing a semiconductor device according to claim 11, wherein the plurality of waveguides is juxtaposed for one substrate, wherein a slit is placed on a side of each of the plurality of waveguides which faces another waveguide, wherein the microwave is supplied through the slit, and wherein the plasma is generated by the microwave.

14. The method for manufacturing a semiconductor device according to claim 11, wherein the reactive gas contains helium and a semiconductor material gas, wherein a plurality of nozzles is provided in the treatment chamber, and wherein the helium is made to flow from one of the plurality of nozzles and the semiconductor material gas is made to flow from another one of the plurality of nozzles.

15. The method for manufacturing a semiconductor device according to claim 11, wherein the semiconductor device is a photovoltaic system.

16. A method for manufacturing a semiconductor device comprising:

supplying a reactive gas containing helium to a first treatment chamber having a plurality of waveguides which is juxtaposed so as to be projected in a comb-shape;

forming a first semiconductor layer of a microcrystalline semiconductor over a substrate placed in the first treatment chamber by supplying a microwave to space sandwiched between the plurality of waveguides to generate plasma, while maintaining a pressure in the first treatment chamber at equal to or greater than $1\times10^2$ Pa and equal to or less than $1\times10^5$ Pa;

transferring the substrate from the first treatment chamber into a second treatment chamber having a plurality of waveguides which is juxtaposed so as to be projected in a comb-shape without exposing the substrate to air;

supplying a reactive gas containing helium to the second treatment chamber;

forming a second semiconductor layer of a microcrystalline semiconductor over the first semiconductor layer placed in the second treatment chamber by supplying a microwave to space sandwiched between the plurality of waveguides to generate plasma, while maintaining a pressure in the second treatment chamber at equal to or greater than $1\times10^2$ Pa and equal to or less than $1\times10^5$ Pa;

transferring the substrate from the second treatment chamber into a third treatment chamber having a plurality of waveguides which is juxtaposed so as to be projected in a comb-shape without exposing the substrate to air;

supplying a reactive gas containing helium to the third treatment chamber; and forming a third semiconductor layer of a microcrystalline semiconductor over the second semiconductor layer placed in the third treatment chamber by supplying a microwave to space sandwiched between the plurality of waveguides to generate plasma, while maintaining a pressure in the third treatment chamber at equal to or greater than $1\times10^2$ Pa and equal to or less than $1\times10^5$ Pa.

17. The method for manufacturing a semiconductor device according to claim 16, wherein the plasma has an electron density of equal to or greater than $1\times10^{11}$ cm$^{-3}$ and equal to or less than $1\times10^{13}$ cm$^{-3}$, and an electron temperature of equal to or greater than 0.2 eV and equal to or less than 2.0 eV.

18. The method for manufacturing a semiconductor device according to claim 16, wherein the plurality of waveguides is juxtaposed for one substrate, wherein a slit is placed on a side of each of the plurality of waveguides which faces another waveguide, wherein the microwave is supplied through the slit, and wherein the plasma is generated by the microwave.

19. The method for manufacturing a semiconductor device according to claim 16, wherein the reactive gas contains helium and a semiconductor material gas, wherein a plurality of nozzles are provided in each of the first to third treatment chambers, and wherein the helium is made to flow from one of the plurality of nozzles and the semiconductor material gas is made to flow from another one of the plurality of nozzles in each of the first to third treatment chambers.

20. The method for manufacturing a semiconductor device according to claim 16, wherein the semiconductor device is a photovoltaic system.

* * * * *

UNITED STATES PATENT AND TRADEMARK OFFICE
CERTIFICATE OF CORRECTION

PATENT NO.         : 7,736,933 B2
APPLICATION NO.    : 12/219241
DATED              : June 15, 2010
INVENTOR(S)        : Yasuyuki Arai et al.

It is certified that error appears in the above-identified patent and that said Letters Patent is hereby corrected as shown below:

At column 17, line 58, "CZPA" should be --CzPA--;

At column 27, line 28, "$cm^3$" should be --$cm^{-3}$--.

Signed and Sealed this

Sixteenth Day of November, 2010

David J. Kappos
*Director of the United States Patent and Trademark Office*